(12) United States Patent
Lai

(10) Patent No.: US 12,256,534 B2
(45) Date of Patent: Mar. 18, 2025

(54) SEMICONDUCTOR DEVICE HAVING DOUBLE BIT CAPACITY AND METHOD FOR MANUFACTURING THE SAME

(71) Applicant: NANYA TECHNOLOGY CORPORATION, New Taipei (TW)

(72) Inventor: Ying-Chieh Lai, Zhubei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 92 days.

(21) Appl. No.: 18/218,218

(22) Filed: Jul. 5, 2023

(65) Prior Publication Data

US 2024/0023313 A1 Jan. 18, 2024

Related U.S. Application Data

(62) Division of application No. 17/866,720, filed on Jul. 18, 2022.

(51) Int. Cl.
*H10B 12/00* (2023.01)
(52) U.S. Cl.
CPC ........... *H10B 12/34* (2023.02); *H10B 12/053* (2023.02)
(58) Field of Classification Search
None
See application file for complete search history.

(56) References Cited

U.S. PATENT DOCUMENTS

| 7,420,861 | B2 | 9/2008 | Lee et al. |
| 10,665,292 | B1 | 5/2020 | Raad et al. |
| 2008/0303545 | A1 | 12/2008 | Chow |
| 2023/0422461 | A1* | 12/2023 | Vega ................... H01L 23/5286 |

FOREIGN PATENT DOCUMENTS

TW 389915 B 5/2000

OTHER PUBLICATIONS

Office Action and and the search report mailed on Nov. 14, 2023 related to Taiwanese Application No. 111125413.

* cited by examiner

*Primary Examiner* — Hsien Ming Lee
(74) *Attorney, Agent, or Firm* — Xuan Zhang

(57) ABSTRACT

A semiconductor device and a method of manufacturing a semiconductor device are provided. The semiconductor device includes a semiconductor substrate, a trench, and a word line structure in the trench. The semiconductor substrate has a first active region and an isolation layer. The first active region includes a first sub-active region, a second sub-active region, and a first separation channel separating the first sub-active region from the second sub-active region. The word line structure is adjacent to the first active region and includes a word line insulating layer covering inner side surfaces of the trench, a word line electrode on the word line insulating layer, and a word line capping structure on the word line electrode. A depth of the first separation channel is substantially identical to a thickness of the isolation layer.

19 Claims, 30 Drawing Sheets

SEMICONDUCTOR DEVICE HAVING DOUBLE BIT CAPACITY AND METHOD FOR MANUFACTURING THE SAME

CROSS-REFERENCE TO RELATED APPLICATION

This application is a divisional application of U.S. Non-Provisional application Ser. No. 17/866,720 filed 18 Jul. 2022, which is incorporated herein by reference in its entirety.

TECHNICAL FIELD

The present disclosure relates to a semiconductor device and a method for manufacturing a semiconductor device, and more particularly, to a double bit capability of the active region.

DISCUSSION OF THE BACKGROUND

Semiconductor devices are used in a variety of electronic applications, such as personal computers, cellular phones, digital cameras, and other electronic equipment. The dimensions of semiconductor devices are continuously being scaled down to meet the increasing demand of computing ability. However, a variety of issues arise during the scaling-down process, and the number of such issues is continuously increasing. Therefore, challenges remain with regard to reducing complexity as well as improving quality, yield, performance, and reliability. In addition, the bit capability of memory devices also needs to be enhanced.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a semiconductor substrate. The semiconductor substrate includes a first active region and an isolation layer adjacent to the first active region. The first active region includes a first sub-active region, a second sub-active region, and a first separation channel separating the first sub-active region from the second sub-active region. A depth of the first separation channel is substantially identical to a thickness of the isolation layer.

Another aspect of the present disclosure provides a semiconductor device. The semiconductor device includes a semiconductor substrate, a trench, and a word line structure in the trench. The semiconductor substrate has a first active region and an isolation layer. The a first active region includes a first sub-active region, a second sub-active region, and a first separation channel separating the first sub-active region from the second sub-active region. The word line structure is adjacent to the first active region and includes a word line insulating layer covering inner side surfaces of the trench, a word line electrode on the word line insulating layer, and a word line capping structure on the word line electrode. A depth of the first separation channel is substantially identical to a thickness of the isolation layer.

In some embodiments, a thickness of the word line structure is substantially identical to a thickness of the isolation layer.

In some embodiments, the first sub-active region is defined by the first separation channel and the isolation layer.

In some embodiments, the second sub-active region is defined by the first separation channel and the isolation layer.

In some embodiments, the first active region has at least one corner, and the at least one corner is angled.

In some embodiments, the at least one corner is a right angle.

In some embodiments, the at least one corner is an obtuse angle.

In some embodiments, the first active region has a first corner and a second corner adjacent to the first corner, and the first corner and the second corner are symmetric.

In some embodiments, the first active region includes a doped region.

In some embodiments, the first sub-active region includes a first doped region and the second sub-active region includes a second doped region.

In some embodiments, the semiconductor substrate further includes a second active region having a third sub-active region, a fourth sub-active region, and a second separation channel separating the third sub-active region from the fourth sub-active region.

In some embodiments, the trench intersects the first sub-active region and the second sub-active region of the first active region and the third sub-active region and the fourth sub-active region of the second active region.

Another aspect of the present disclosure provides a method of manufacturing a semiconductor device. The method includes providing a semiconductor substrate; defining a plurality of active regions in the semiconductor substrate by corresponding lithographic operations; forming an isolation layer in the semiconductor substrate to surround the plurality of active regions; and defining a first sub-active region and a second sub-active region for each of the plurality of active regions by corresponding lithographic operations and removing a portion of each active region to form a separation channel of each active region. A depth of the separation channel is substantially identical to a thickness of the isolation layer.

In some embodiments, the removal operation includes an etching operation, and wherein a depth bias between the depths of the separation channels of the plurality of active regions is between 0 to 25%.

In some embodiments, the depth bias between the depths of the separation channels of the plurality of active regions is between 0 to 15%.

In some embodiments, the depth bias between the depths of the separation channels of the plurality of active regions is between 0 to 5%.

In some embodiments, the depth bias between the depths of the separation channels of the plurality of active regions is substantially 0.

In some embodiments, an ion implantation operation is performed on the plurality of active regions after forming an isolation layer.

In some embodiments, each active region is formed to have at least one corner, and the at least one corner is angled.

In some embodiments, the at least one corner is a right angle.

In some embodiments, the at least one corner is an obtuse angle.

Defining a plurality of active regions and defining a first sub-active region and a second sub-active region for each of the plurality of active regions by corresponding lithographic operations can help to form a double bit capability for the active region. A larger window for etching operations can be obtained.

In addition, a top surface area of each active region can be increased because no over-etching occurs during the etching operations. Accordingly, the depth of the separation channel can be controlled so that it is substantially identical to the thickness of the isolation layer.

The foregoing has outlined rather broadly the features and technical advantages of the present disclosure so that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1A:
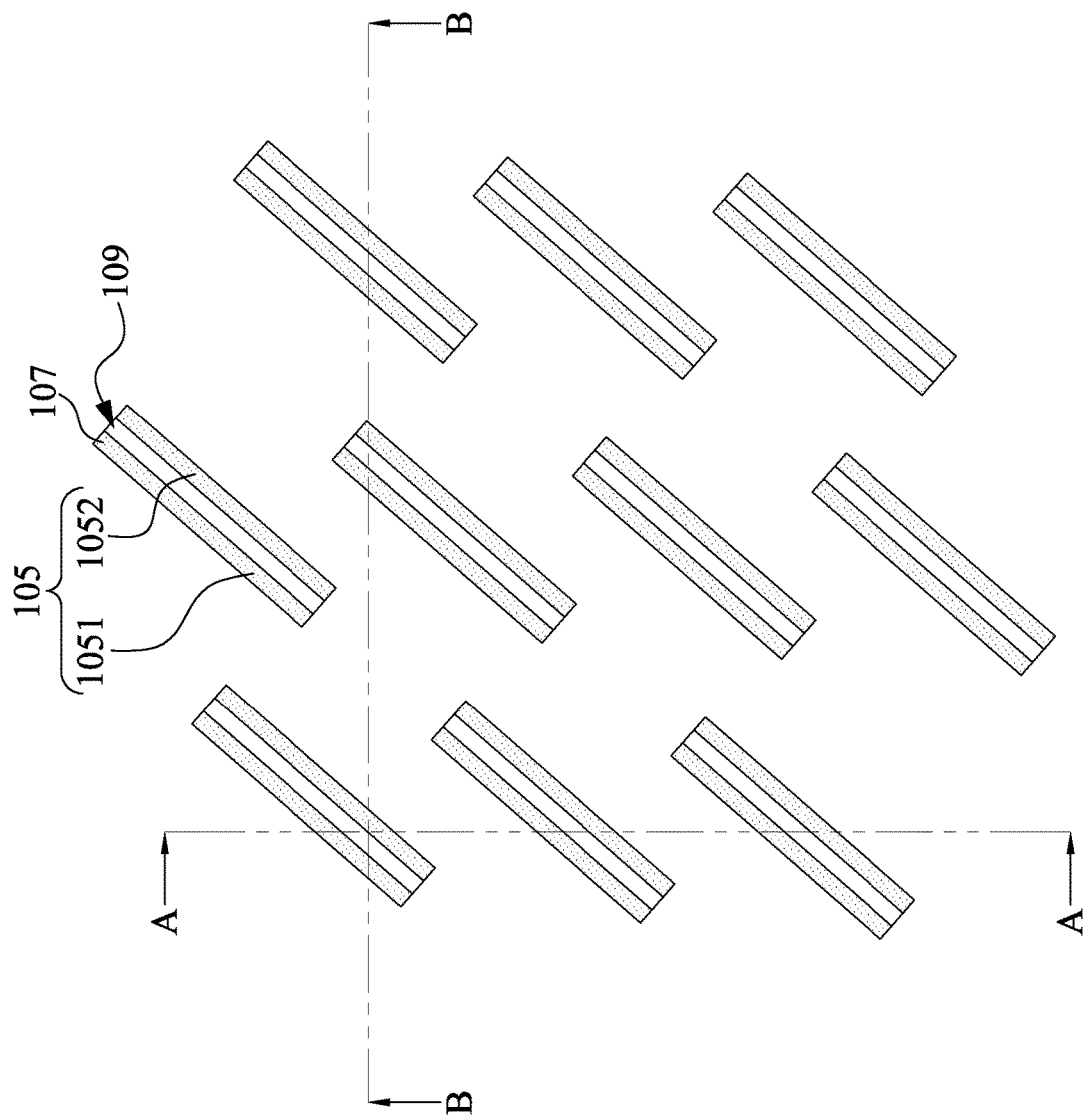
FIG. 1A is a schematic plane view of a semiconductor device in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only, and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientations, layouts, locations, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device. Specifically, semiconductor devices of embodiments of the present disclosure may be dynamic random-access memory devices.

Figure 1B:
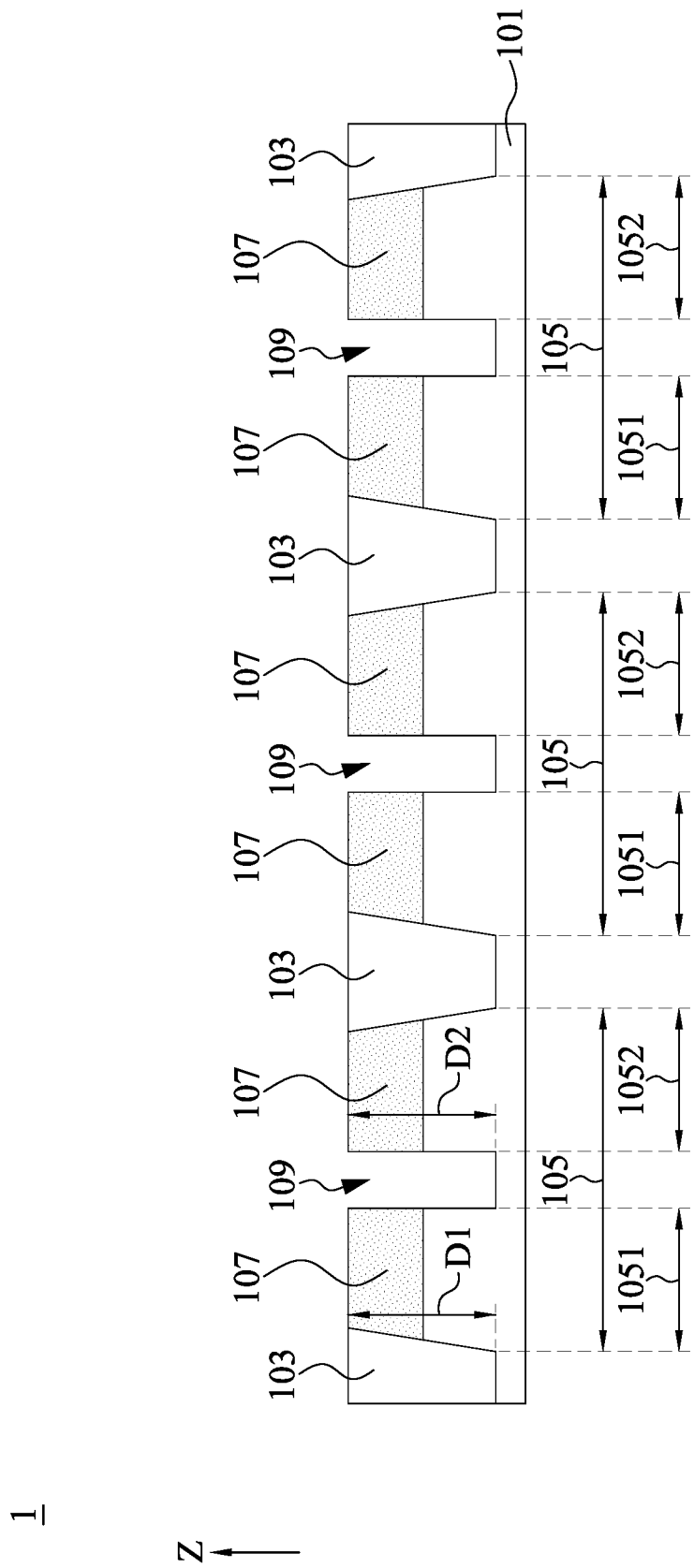
FIG. 1B is a schematic cross-sectional view illustrating the semiconductor device taken along an A-A line shown in FIG. 1A.
Figure 1C:
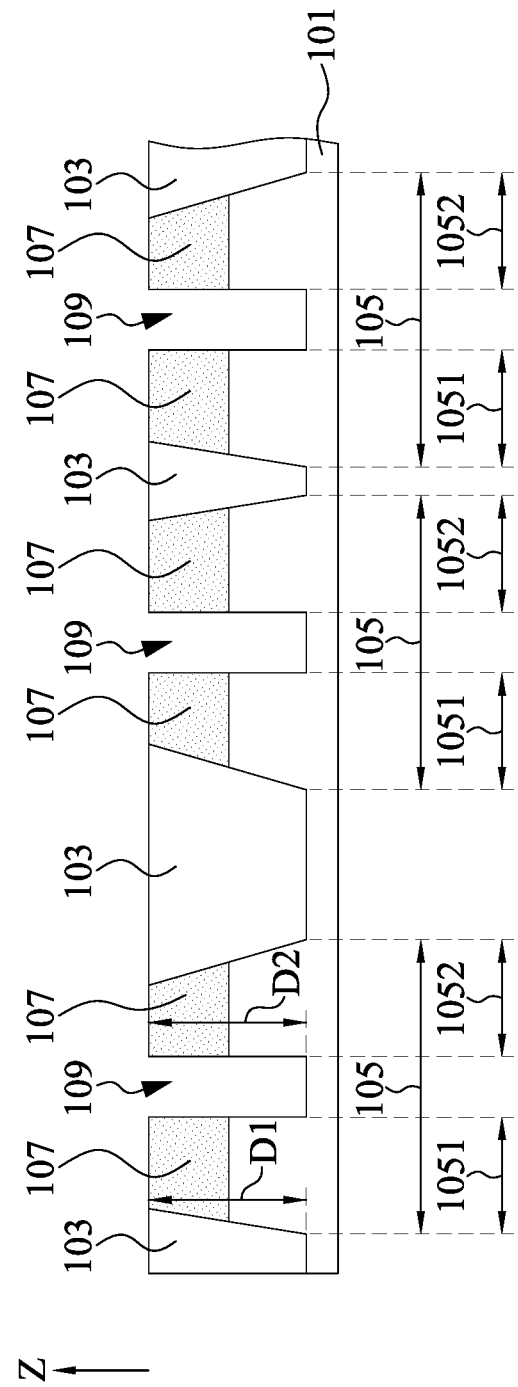
FIG. 1C is a schematic cross-sectional view illustrating the semiconductor device taken along a B-B line shown in FIG. 1A.

FIG. 1A is a schematic plane view of a semiconductor device 1 in accordance with some embodiments of the present disclosure. FIG. 1B is a schematic cross-sectional view illustrating the semiconductor device 1 taken along an A-A line shown in FIG. 1A. FIG. 1C is a schematic cross-sectional view illustrating the semiconductor device 1 taken along a B-B line shown in FIG. 1A.

It should be noted that, in the description of the present disclosure, above (or up) corresponds to the direction of the arrow of the direction Z, and below (or down) corresponds to the opposite direction of the arrow of the direction Z.

Referring to FIG. 1A, the semiconductor device 1 includes a plurality of active regions 105 defined in a semiconductor substrate. The plurality of active regions 105 include doped regions 107. The plurality of active regions 105 may be surrounded by an isolation layer 103. For simplicity, the isolation layer 103 is not shown in FIG. 1A.

In some embodiments, the semiconductor substrate may be a semiconductor wafer. The semiconductor substrate may be a silicon substrate. Alternatively, the semiconductor substrate may comprise another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP, or combinations thereof. In other embodiments, the semiconductor substrate may include for example, an insulating layer such as a $SiO_2$ or a $Si_3N_4$ layer in addition to a semiconductor substrate portion. Thus, the term substrate also includes silicon-on-glass, silicon-on-sapphire substrates. Also, the semiconductor substrate may be any other base on which a layer is formed, for example, a glass or metal layer. Accordingly, the substrate may be a wafer such as a blanket wafer or may be a layer applied to another base material, e.g., an epitaxial layer grown onto a lower layer.

Each of the plurality of active regions 105 may include a rectangular shape or a square shape. Each of the plurality of active regions 105 includes a sub-active region 1051 and a sub-active region 1052. The sub-active region 1051 is separated from the sub-active region 1052 by a separation channel 109. The sub-active region 1051 and the sub-active region 1052 are symmetric. Each of the sub-active regions has substantially a same length, width, and height. Each of the sub-active regions has substantially a same top surface area. Since each active region 105 has two sub-active regions, the active region 105 has double bit capacity. Also, the rectangular shape or the square shape of the active region 105 could increase the surface area of the active region 105. In addition, the double bit capacity of the active region 105 would be stable and balanced due to the same top surface area.

Each of the plurality of active regions 105 may include four corners or chamfers. The corners are angled. The corners are right angles. The adjacent two corners are symmetric.

FIG. 1B is a schematic cross-sectional view illustrating the semiconductor device 1 taken along an A-A line shown in FIG. 1A. The active regions 105 are formed in a semiconductor substrate 101. Each of the active regions 105 includes the sub-active region 1051 and the sub-active region 1052. The separation channel 109 separates the sub-active region 1051 from the sub-active region 1052. The sub-active region 1051 is defined by the separation channel 109 and the isolation layer 103. The sub-active region 1052 is defined by the separation channel 109 and the isolation layer 103.

Each of the active regions 105 is surrounded by an isolation layer/isolation region 103. A depth D2 of the separation channel 109 is substantially identical to a thickness D1 of the isolation layer 103. The isolation layer 103 may include an insulating material such as silicon oxide, silicon nitride, silicon oxynitride, silicon nitride oxide, or fluoride-doped silicate. In some embodiments, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

The doped region 107 is disposed in the active region 105. A top surface of the doped region 107 and a top surface of the isolation layer 103 are substantially coplanar.

FIG. 1C is a schematic cross-sectional view illustrating the semiconductor device 1 taken along a B-B line shown in FIG. 1A.

The isolation layer 103 is disposed between two active regions 105.

Figure 1D:
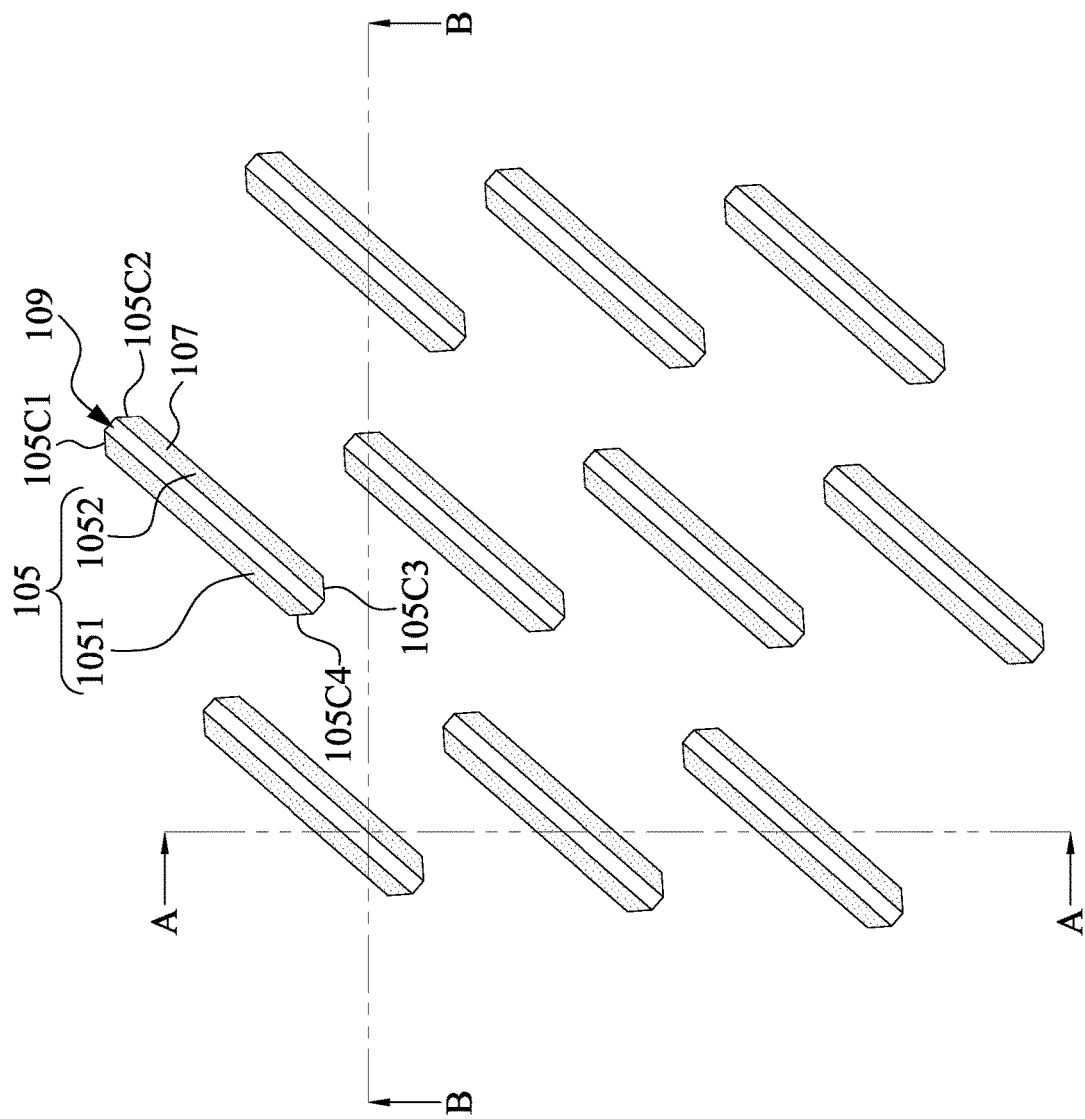
FIG. 1D is a schematic plane view of a semiconductor device in accordance with some embodiments of the present disclosure.

FIG. 1D is a schematic plane view of a semiconductor device 1' in accordance with some embodiments of the present disclosure. The depicted structure of FIG. 1D is similar to the structure depicted in FIG. 1A, except that corners or chamfers 105C1, 105C2, 105C3, 105C4 of the active region 105 of FIG. 1D are obtuse angles. The corners 105C1 and 105C2 of the active region 105 are symmetric. The corners 105C3 and 105C4 of the active region 105 are symmetric.

Figure 2A:
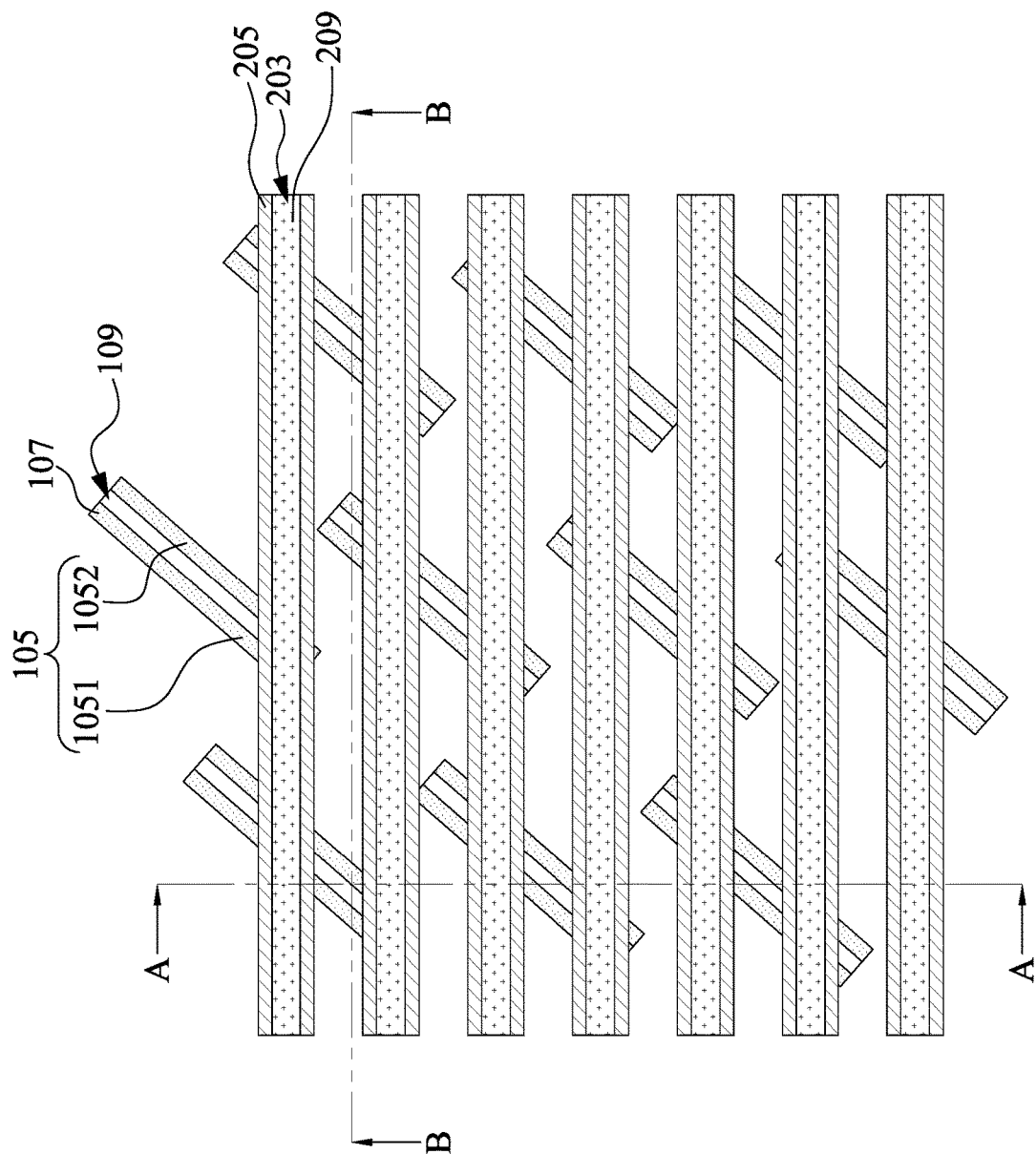
FIG. 2A is a schematic plane view of a semiconductor device in accordance with some embodiments of the present disclosure.
Figure 2B:
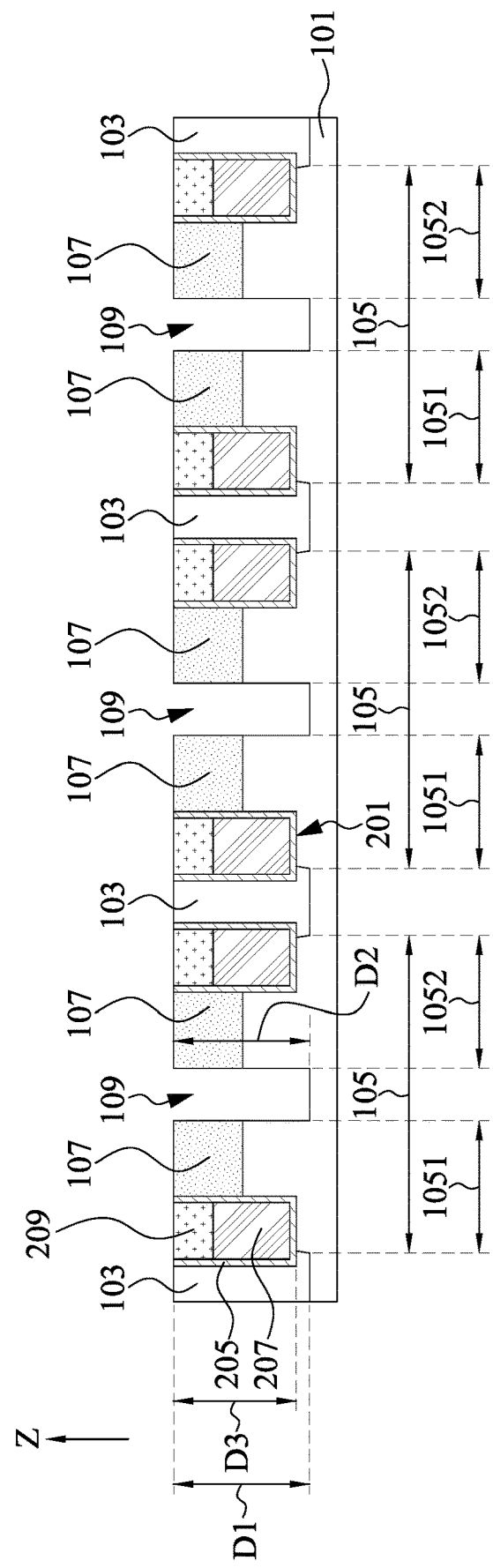
FIG. 2B is a schematic cross-sectional view illustrating the semiconductor device taken along an A-A line shown in FIG. 2A.
Figure 2C:
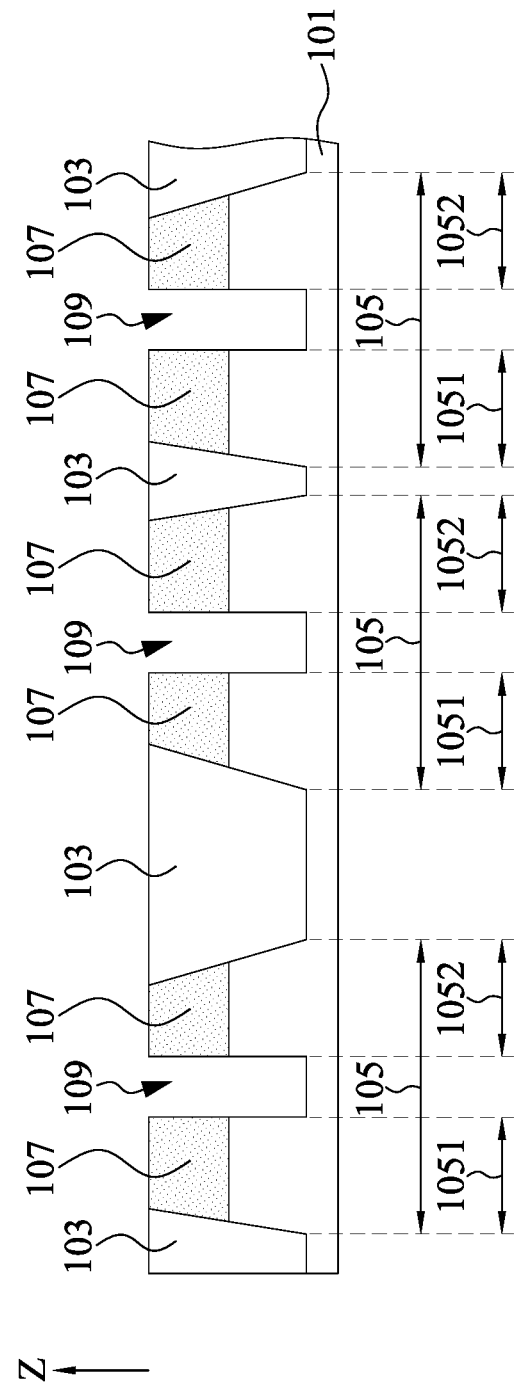
FIG. 2C is a schematic cross-sectional view illustrating the semiconductor device taken along a B-B line shown in FIG. 2A.

FIG. 2A is a schematic plane view of a semiconductor device 2 in accordance with some embodiments of the present disclosure. FIG. 2B is a schematic cross-sectional view illustrating the semiconductor device 2 taken along an A-A line shown in FIG. 2A. FIG. 2C is a schematic cross-sectional view illustrating the semiconductor device 2 taken along a B-B line shown in FIG. 2A.

Referring to FIG. 2A, the semiconductor device 2 includes a plurality of active regions 105 defined in a semiconductor substrate. The plurality of active regions 105 include doped regions 107. The plurality of active regions 105 may be surrounded by an isolation layer 103. For simplicity, the isolation layer 103 is not shown in FIG. 2A.

The structures of the active regions 105 and doped regions 107 are similar to those of the active regions 105 and doped regions 107 illustrated in FIG. 1A. In some embodiments, the structures of the active regions 105 and doped regions 107 are similar to those of the active regions 105 and doped regions 107 illustrated in FIG. 1D.

A word line structure 201 is disposed in a word line trench 203. The word line trench 203 extends over the active regions 105. The word line trench 203 intersects the sub-active region 1051 and the sub-active region 1052 of each of the active regions 105.

The word line structure 201 is disposed in the word line trench 203. The word line structure 201 includes a word line insulating layer 205 and a word line capping structure 209. The word line structure 201 intersects the active regions 105. The word line structure 201 intersects the respective sub-active regions 1051 and the respective sub-active regions 1052 of the active regions 105. There are two word line structures 201 intersecting one active region 105. In some embodiments, there are three word line structures 201 intersecting one active region 105.

FIG. 2B is a schematic cross-sectional view illustrating the semiconductor device 2 taken along an A-A line shown in FIG. 2A. The active regions 105 are formed in a semiconductor substrate 101. Each of the active regions 105 includes the sub-active region 1051 and the sub-active region 1052. The separation channel 109 separates the sub-active region 1051 from the sub-active region 1052. A depth D2 of the separation channel 109 is substantially identical to a thickness D1 of the isolation layer 103. The sub-active region 1051 and the sub-active region 1052 of the active region 105 are sandwiched by two word line structures 201.

The doped region 107 is disposed in the active region 105. A top surface of the doped region 107 and a top surface of the isolation layer 103 are substantially coplanar.

The word line structure 201 is disposed in the word line trench 203 and adjacent to the active region 105. The word line structure 201 includes the word line insulating layer 205, a word line electrode 207, and the word line capping structure 209. A thickness D3 of the word line structure 201 is less than the thickness D1 of the isolation layer 103. In some embodiments, the thickness D3 of the word line structure 201 may be identical to the thickness D1 of the isolation layer 103.

The word line insulating layer 205 covers inner side surfaces of the word line trench 203. The word line electrode 207 is disposed on the word line insulating layer 205. The word line capping structure 209 is disposed on the word line electrode 207. The word line insulating layer 205, the word line electrode 207, and the word line capping structure 209 are disposed in the word line trench 203. A top surface of the word line capping structure 209 and the top surface of the isolation layer 103 are substantially coplanar.

FIG. 2C is a schematic cross-sectional view illustrating the semiconductor device 2 taken along a B-B line shown in FIG. 2A.

The isolation layer 103 is disposed between two active regions 105.

FIGS. 3 to 25 illustrate stages of a method of manufacturing a semiconductor device in accordance with some embodiments of the present disclosure. At least some of these figures have been simplified for a better understanding of the aspects of the present disclosure. In some embodiments, the semiconductor device 1 in FIGS. 1A, 1B, 1C, and 1D may be manufactured by the operations described below with respect to FIGS. 3 to 12. In some embodiments, the semiconductor device 2 in FIGS. 2A, 2B, and 2C may be manufactured by the operations described below with respect to FIGS. 3 to 25.

Figure 3:
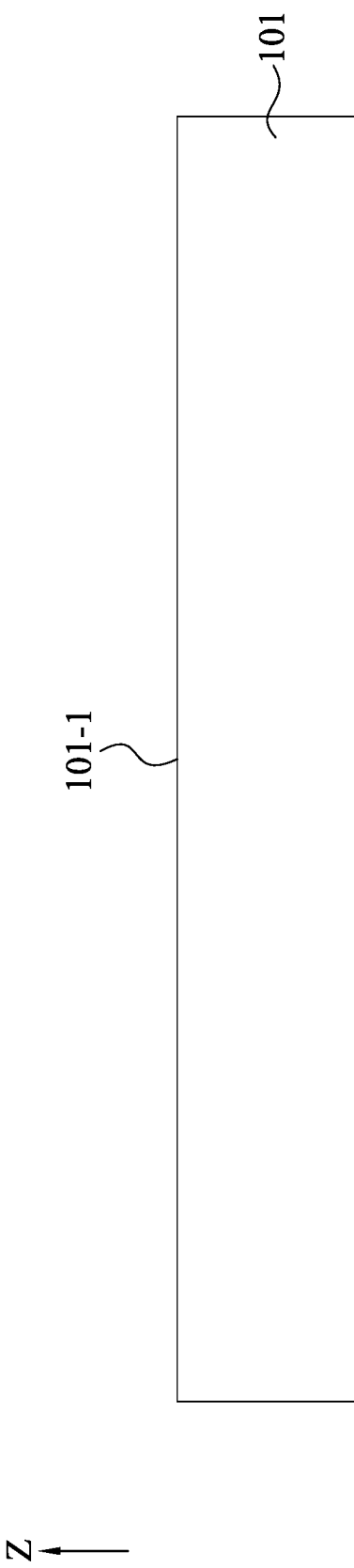
FIG. 3 illustrates one or more stages of a method of manufacturing a semiconductor device in accordance with some embodiments of the present disclosure.

As shown in FIG. 3, a substrate 101 having a top surface 101-1 is provided. The substrate 101 may be formed of, for example, silicon, doped silicon, silicon germanium, silicon on insulator, silicon on sapphire, silicon germanium on insulator, silicon carbide, germanium, gallium arsenide, gallium phosphide, gallium arsenide phosphide, indium phosphide, indium gallium phosphide, or any other IV-IV, III-V or I-VI semiconductor material.

Figure 4:
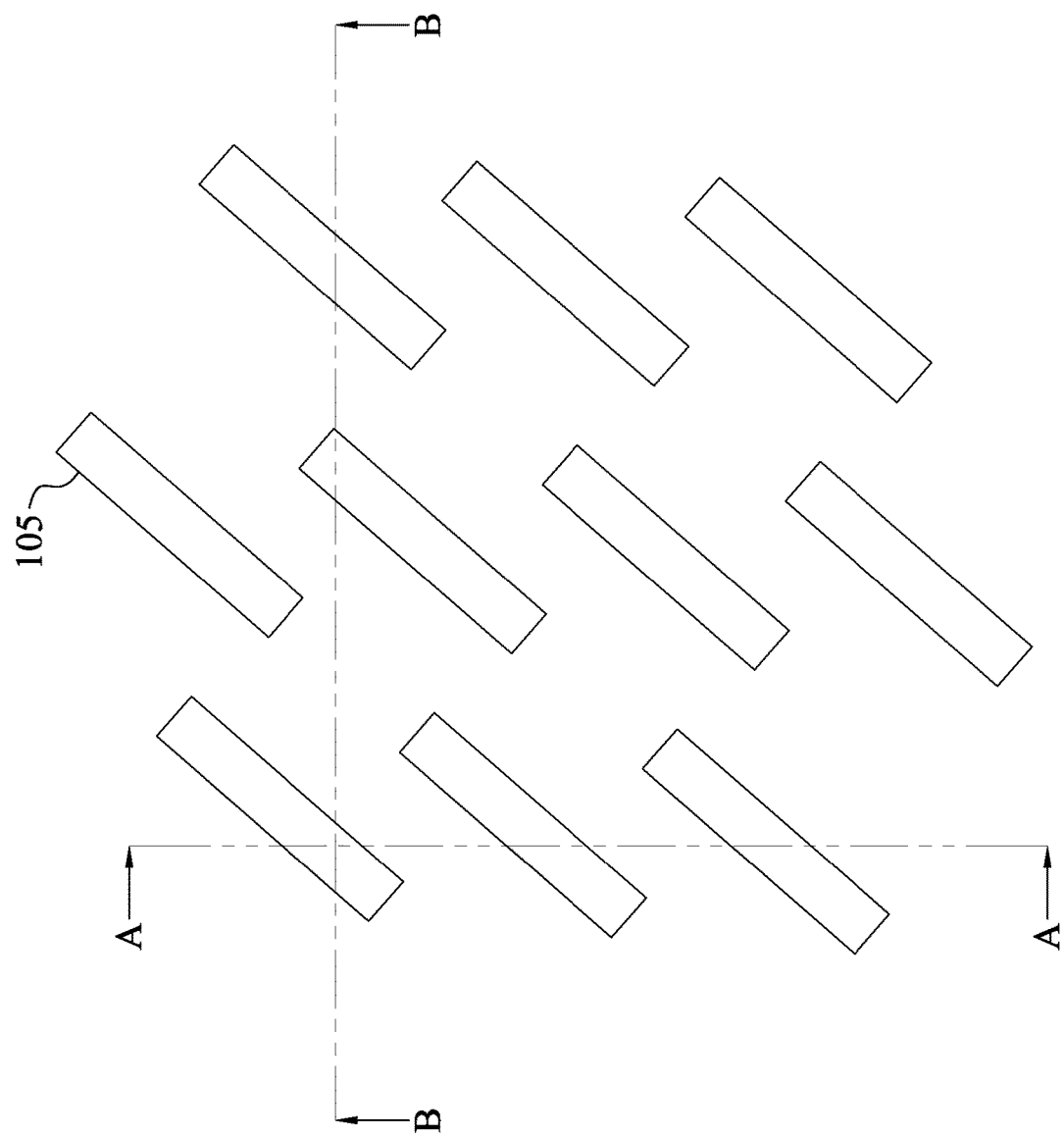
FIG. 4 illustrates one or more stages of a method of manufacturing a semiconductor device in accordance with some embodiments of the present disclosure.
Figure 5:
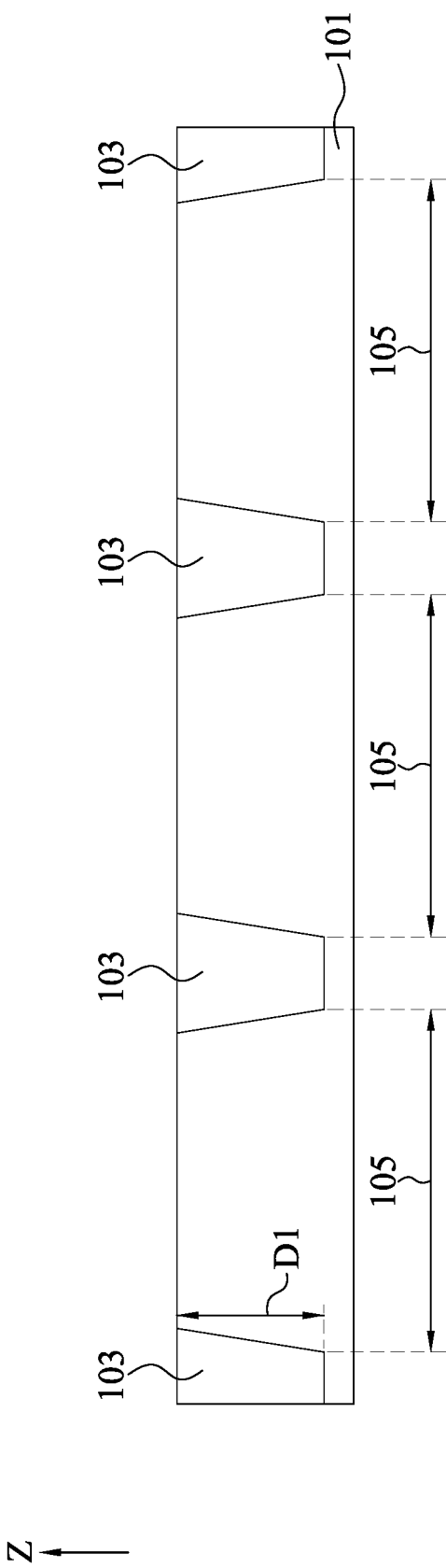
FIG. 5 illustrates one or more stages of a method of manufacturing a semiconductor device in accordance with some embodiments of the present disclosure.
Figure 6:
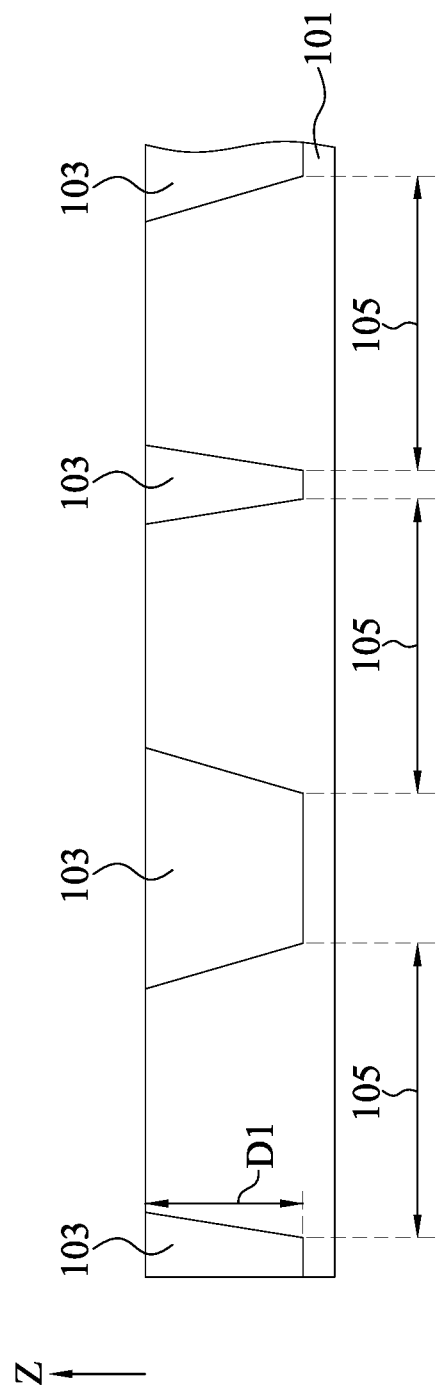
FIG. 6 illustrates one or more stages of a method of manufacturing a semiconductor device in accordance with some embodiments of the present disclosure.

FIGS. 4 to 6 illustrate, in schematic cross-sectional diagrams, part of the flow of fabricating the semiconductor device in accordance with FIG. 3.

As shown in FIG. 4, a plurality of active regions 105 are defined in the substrate 101 through lithographic processes. The plurality of active regions 105 may be patterned by multi-layer hard masks. The multi-layer hard masks may include a plurality of dielectric layers. The plurality of active regions 105 may be defined in one step. In some embodiments, the plurality of active regions 105 may be defined in sequence.

The plurality of active regions 105 may have bar shapes. The plurality of active regions 105 may be parallel to each other. The shapes of the plurality of active regions 105 may be patterned as a rectangle or a square, and top surface areas (i.e., island areas) of the plurality of active regions 105 would be increased. In some embodiments, each active region 105 may have four chamfers with obtuse angles.

As shown in FIGS. 5 and 6, an isolation layer/region 103 may be formed in the substrate 101 and the plurality of active regions 105 of the substrate 101 may be defined by the isolation layer 103. The isolation region 103 may be formed through an STI (shallow trench isolation) process. A photolithography process may be performed to pattern the substrate 101 to define positions of the plurality of active regions 105. An etch process may be performed after the photolithography process to form a plurality of isolation trenches in the substrate 101. After the etch process, an insulating material such as silicon oxide, silicon nitride, silicon oxynitride, silicon nitride oxide, or fluoride-doped silicate, may be used to fill the plurality of isolation trenches by a deposition process. A planarization process, such as chemical mechanical polishing, may be performed after the deposition process to remove excess material and provide a substantially flat surface for subsequent processing steps and conformally form the isolation layer 103 and the plurality of active regions 105. The isolation layer 103 has a depth D1. For simplicity, the isolation layer 103 is not shown in FIG. 3.

Figure 7:
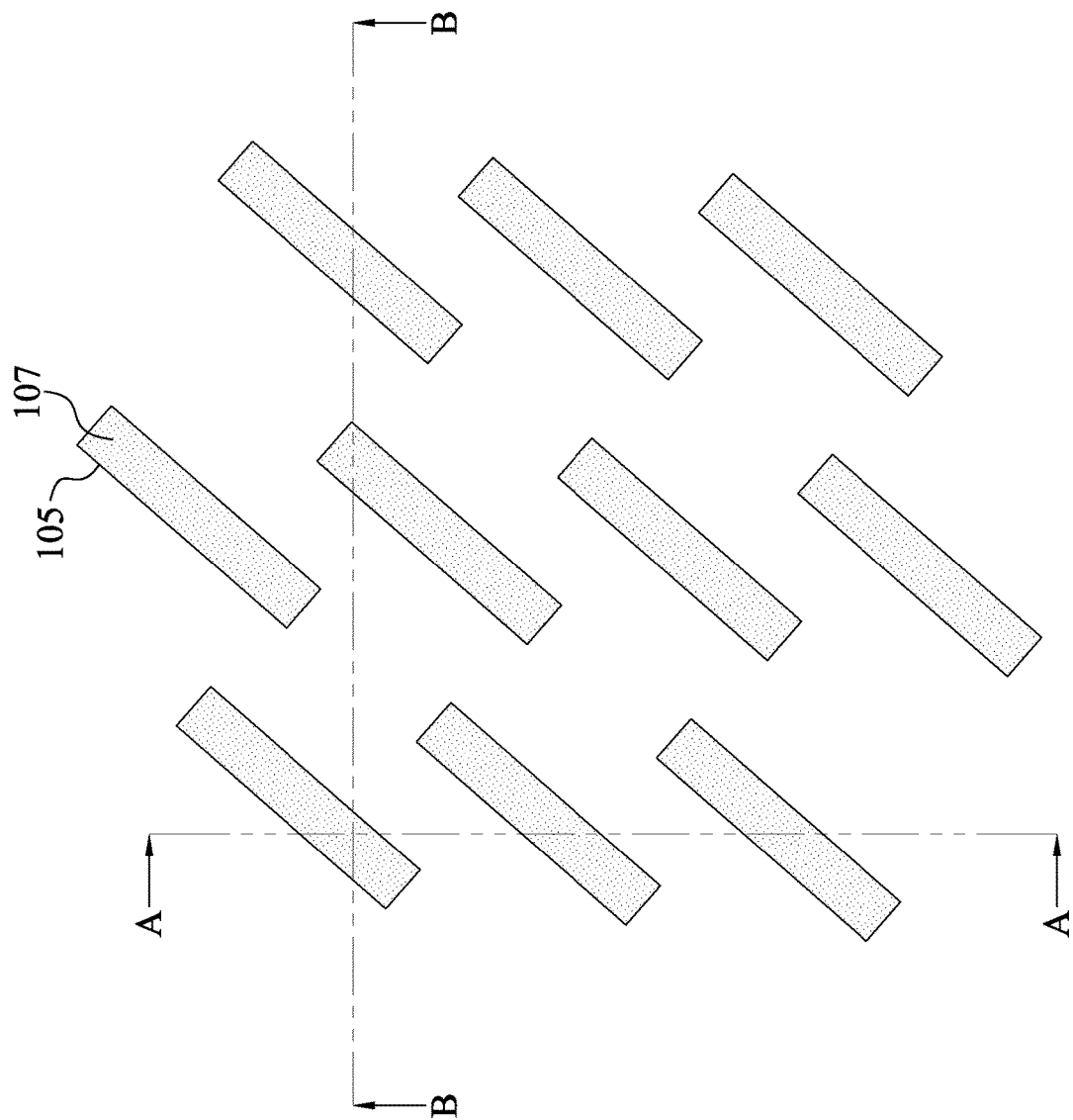
FIG. 7 illustrates one or more stages of a method of manufacturing a semiconductor device in accordance with some embodiments of the present disclosure.
Figure 8:
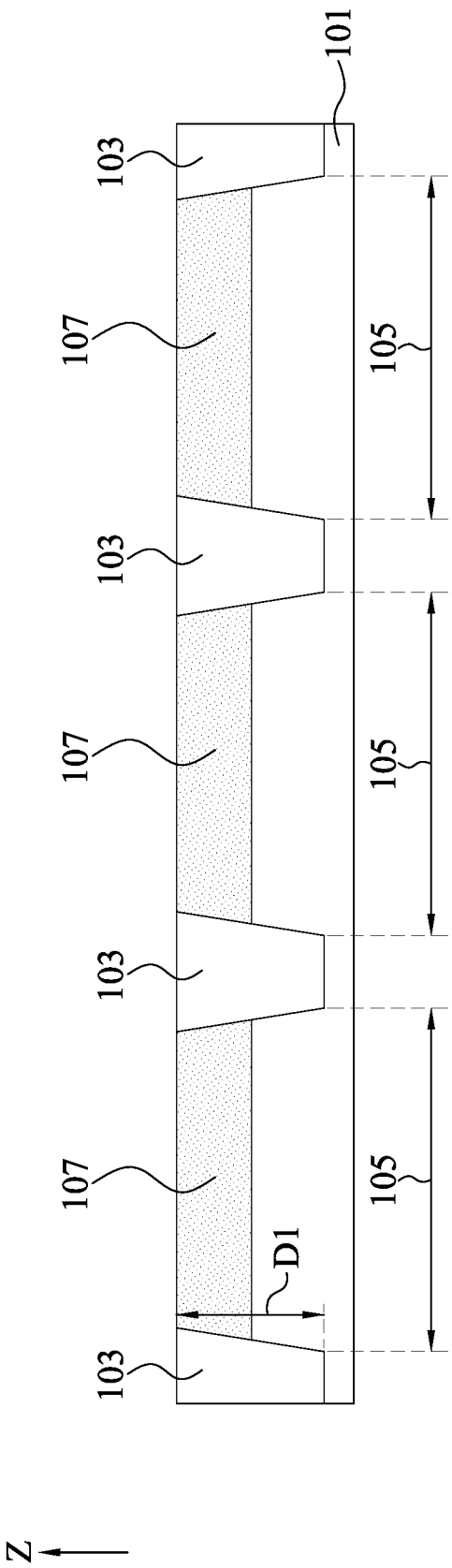
FIG. 8 illustrates one or more stages of a method of manufacturing a semiconductor device in accordance with some embodiments of the present disclosure.
Figure 9:
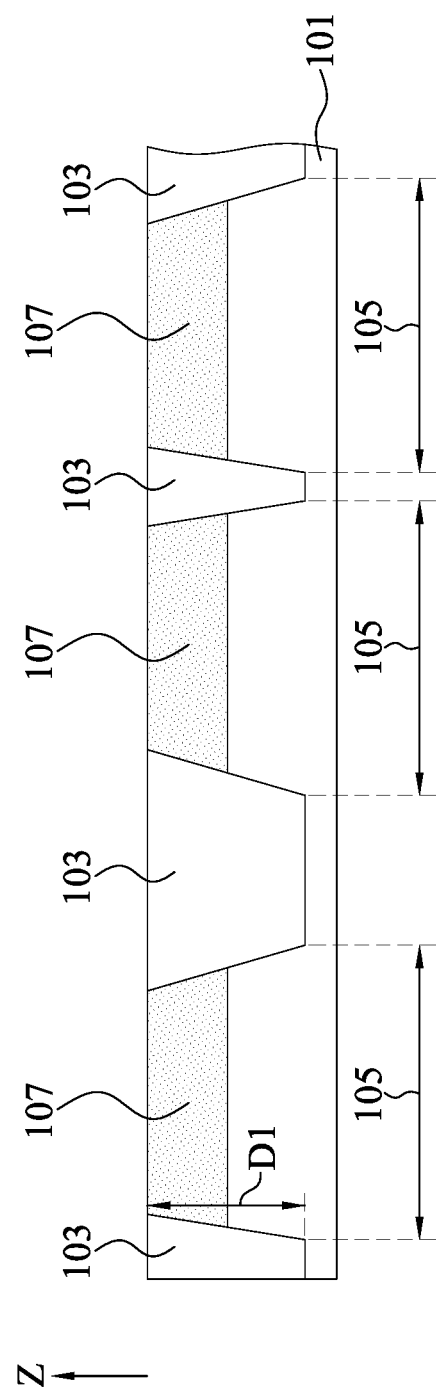
FIG. 9 illustrates one or more stages of a method of manufacturing a semiconductor device in accordance with some embodiments of the present disclosure.

FIG. 7 illustrates, in a schematic top-view diagram, part of the flow of fabricating the semiconductor device in accordance with one embodiment of the present disclosure. FIGS. 8 and 9 illustrate, in schematic cross-sectional diagrams, part of the flow of fabricating the semiconductor device in accordance with FIG. 7. For simplicity, the isolation layer 103 is not shown in FIG. 7.

As shown in FIGS. 7 to 9, a plurality of doped regions 107 are formed in the plurality of active regions 105. The plurality of doped regions 107 are formed by an implantation process using a dopant. The plurality of doped regions 107 may have a dopant concentration ranging from about $10^{17}$ atoms/cm$^3$ to about $10^{19}$ atoms/cm$^3$.

In some embodiments, the doped regions 107 may be doped with an N-type dopant such as phosphorus (P), arsenic (As), or antimony (Sb). In some other embodiments, the doped regions 107 may be doped with a P-type dopant such as boron (B) or indium (In). In some embodiments, the doped regions 107 may be doped with dopants or impurity ions having the same or different conductivity types.

Figure 10:
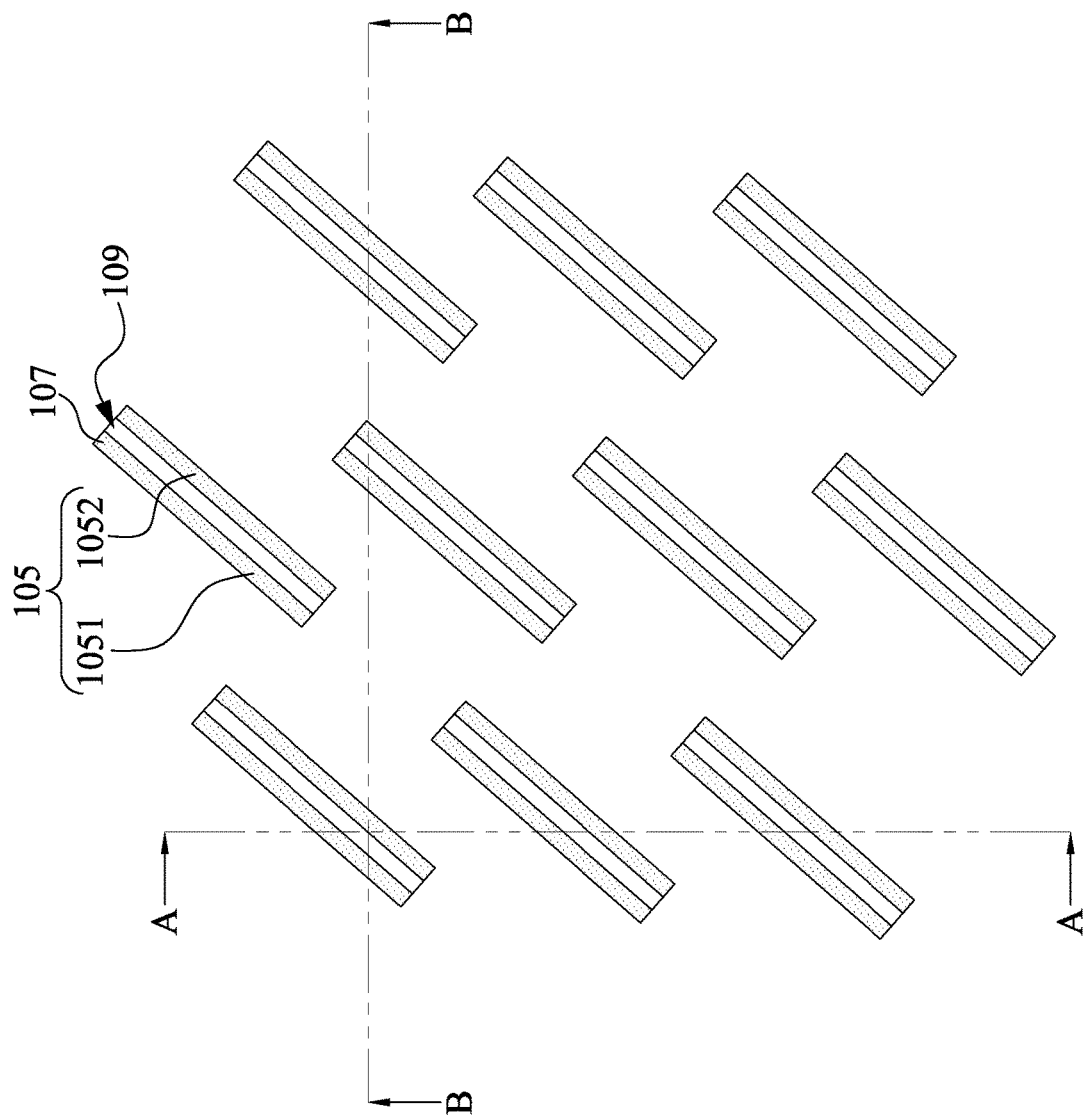
FIG. 10 illustrates one or more stages of a method of manufacturing a semiconductor device in accordance with some embodiments of the present disclosure.
Figure 11:
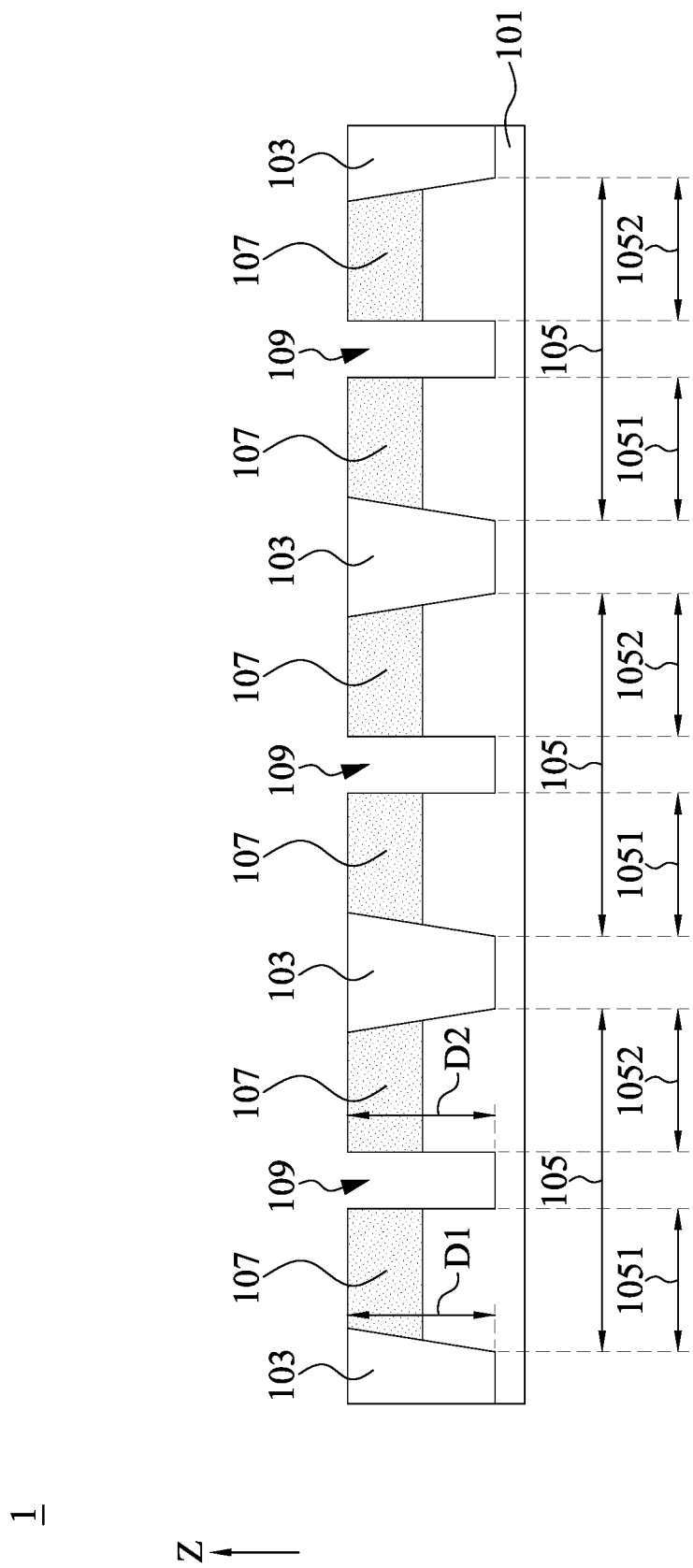
FIG. 11 illustrates one or more stages of a method of manufacturing a semiconductor device in accordance with some embodiments of the present disclosure.
Figure 12:
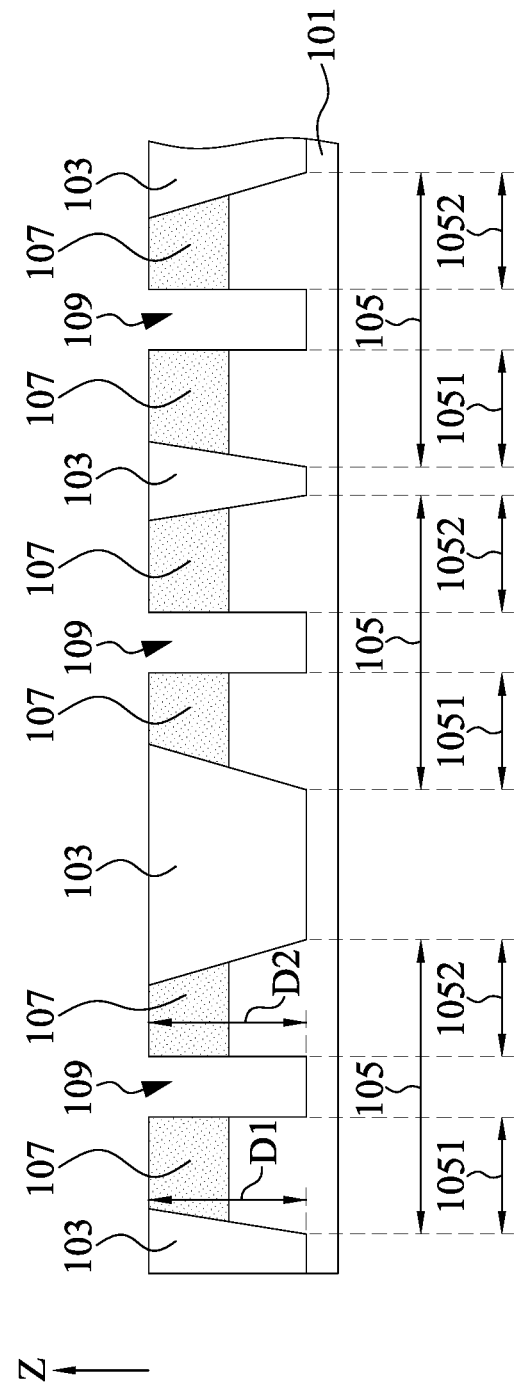
FIG. 12 illustrates one or more stages of a method of manufacturing a semiconductor device in accordance with some embodiments of the present disclosure.

FIG. 10 illustrates, in a schematic top-view diagram, part of the flow of fabricating the semiconductor device in accordance with one embodiment of the present disclosure. FIGS. 11 and 12 illustrate, in schematic cross-sectional diagrams, part of the flow of fabricating the semiconductor device in accordance with FIG. 10. For simplicity, the isolation layer 103 is not shown in FIG. 10.

A photolithography process may be performed to pattern an active region 105 to define a sub-active region 1051 and a sub-active region 1052 of the active region 105. An etch process may be performed after the photolithography process to form a separation channel 109 in the active region 105. Subsequently, the photolithography process and the etching process may be performed to pattern another active region 105 to form a separation channel 109, a sub-active region 1051, and a sub-active region 1052 of said active region 105. A size (i.e., a length, a width, a height) of the sub-active region 1051 is substantially the same as a size of the sub-active region 1052. The sub-active region 1051 and the sub-active region 1052 are symmetric. Said active region 105 has double bit capacity due to the sub-active region 1051 and the sub-active region 1052. The sub-active regions 1051 and the sub-active regions 1052 of the plurality of active regions 105 are formed in sequence. Through the above operations, a large etching window could be obtained. Maximum island areas of the sub-active regions 1051 and the sub-active regions 1052 of the plurality of active regions 105 would be obtained. A depth of each separation channel 109 may be exactly controlled without etching errors. That is, over-etching or insufficient etching could be avoided. Accordingly, cut/space depth bias hard control defects due to micro etching loading effect would be eliminated.

In some embodiments, a depth bias resulting from an etching process may be controlled between 0 to 25%. The depth bias resulting from an etching process may be controlled between 0 to 15%. The depth bias resulting from an etching process may be controlled between 0 to 5%. The depth bias resulting from an etching process may be controlled substantially as 0. Compared with the embodiments, a depth bias formed by a conventional etching process normally exceeds 25%.

As shown in FIGS. 11 and 12, the separation channel 109 has a depth D2. The depth D2 of the separation channel 109 is substantially the same as the depth D1 of the isolation layer 103. A top surface of the isolation layer 103 and a top surface of the sub-active region 1051 or the sub-active region 1052 of the active region 105 are substantially coplanar. The semiconductor device 1 is formed. The semiconductor device 1 has double bit capacity, and the active region 105 still keeps its dimension without increasing its length or width.

Figure 13:
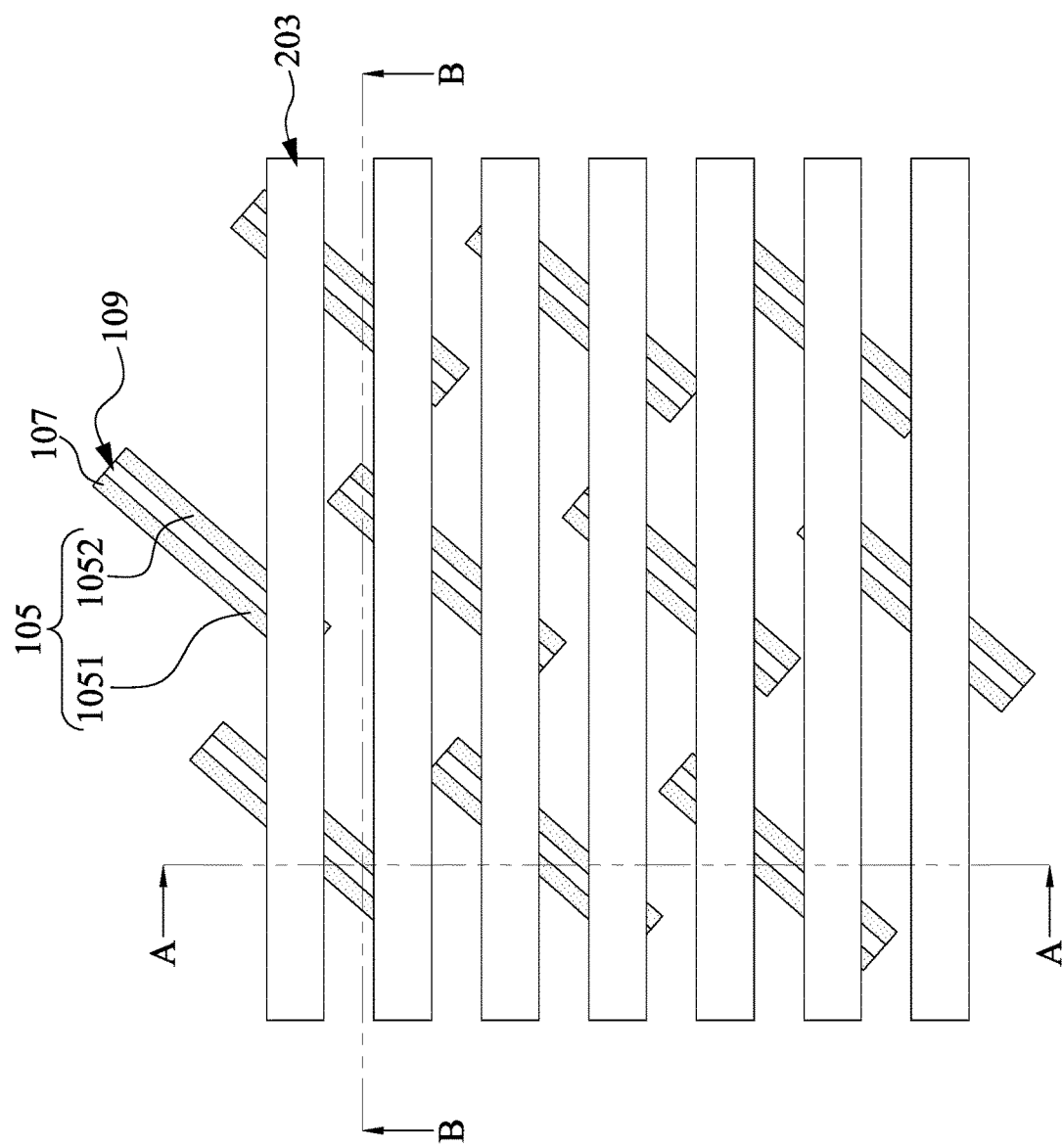
FIG. 13 illustrates one or more stages of a method of manufacturing a semiconductor device in accordance with some embodiments of the present disclosure.
Figure 13:
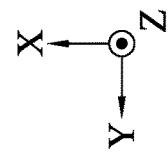
Figure 14:
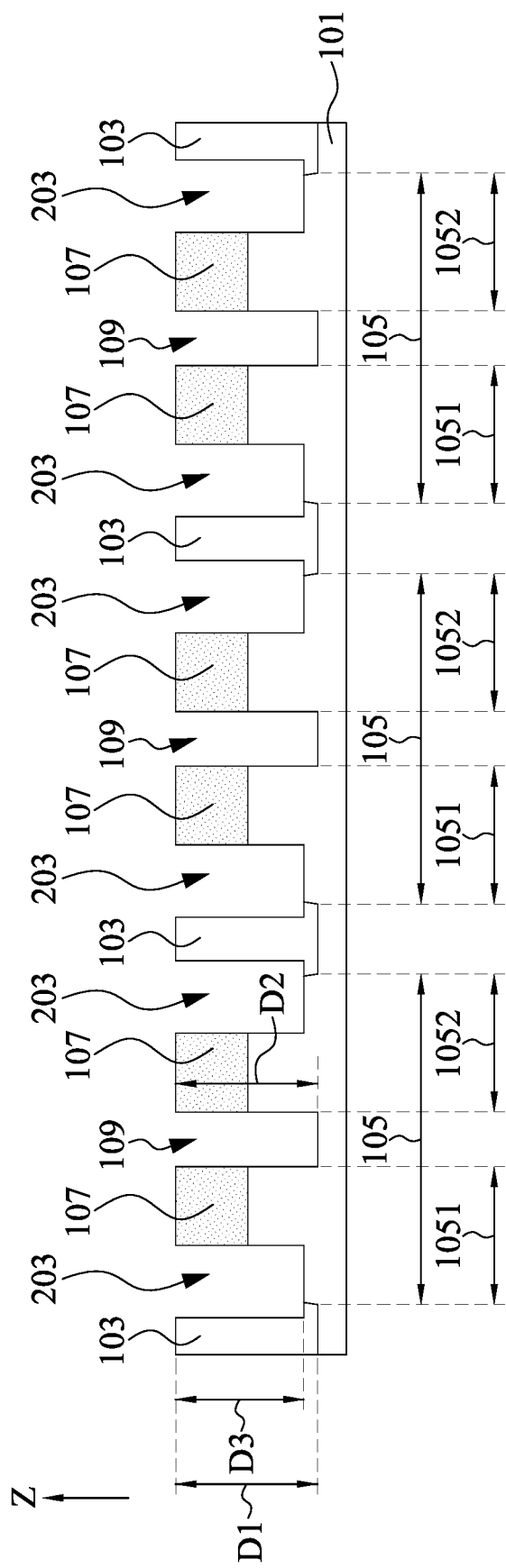
FIG. 14 illustrates one or more stages of a method of manufacturing a semiconductor device in accordance with some embodiments of the present disclosure.
Figure 15:
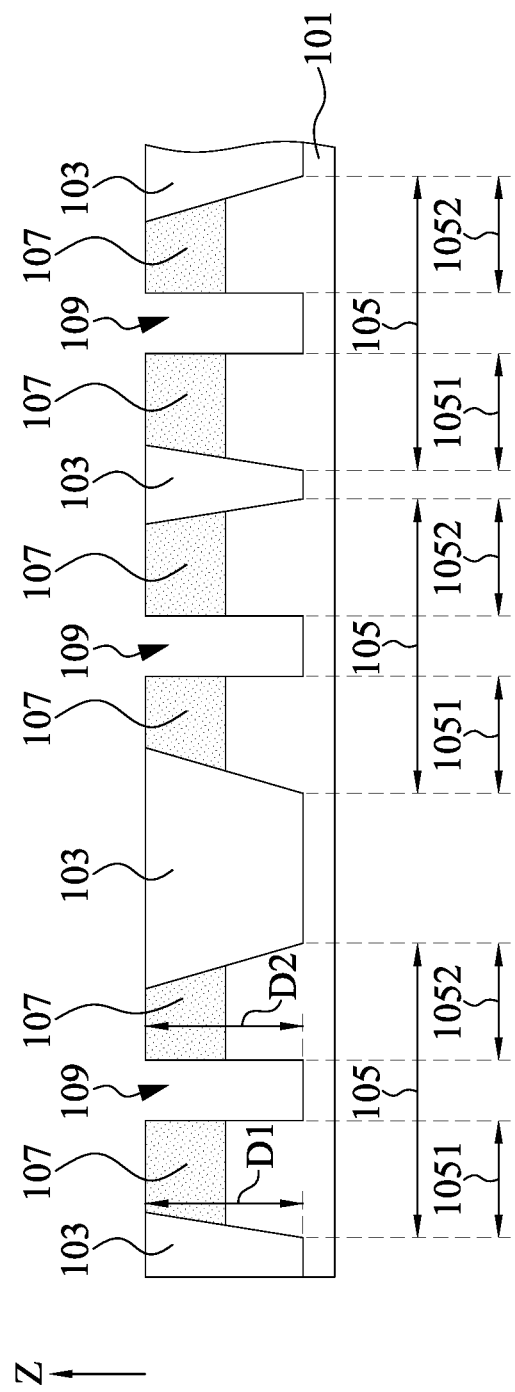
FIG. 15 illustrates one or more stages of a method of manufacturing a semiconductor device in accordance with some embodiments of the present disclosure.

FIG. 13 illustrates, in a schematic top-view diagram, part of the flow of fabricating the semiconductor device in accordance with one embodiment of the present disclosure. FIGS. 14 and 15 illustrate, in schematic cross-sectional diagrams, part of the flow of fabricating the semiconductor device in accordance with FIG. 13. For simplicity, the isolation layer 103 is not shown in FIG. 13.

As shown in FIGS. 13 to 15, a plurality of word line trenches 203 are formed in the substrate 101. A photolithography process may be performed to pattern the substrate 101 to define positions of the plurality of word line trenches 203. An etch process may be performed after the photolithography process to form the plurality of word line trenches 203 in the substrate 101. The plurality of word line trenches 203 may extend in a direction Y to intersect the plurality of active regions 105. One of the plurality of word line trenches 203 may extend in a direction Y to intersect the sub-active region 1051 and the sub-active region 1052 of the active region 105. One of the plurality of active regions 105 may intersect two of the plurality of word line trenches 203. In some embodiments, one of the plurality of active regions 105 may intersect three of the plurality of word line trenches 203. A word line may be formed in the substrate 101. The word line may be formed in the word line trench 203.

As shown in FIG. 14, the word line trench 203 has a depth D3. The depth D3 of the word line trench 203 is less than the depth D1 of the isolation layer 103. In some embodiments, the depth D3 of the word line trench 203 may be the same as the depth D1 of the isolation layer 103 depending on need.

Figure 16:
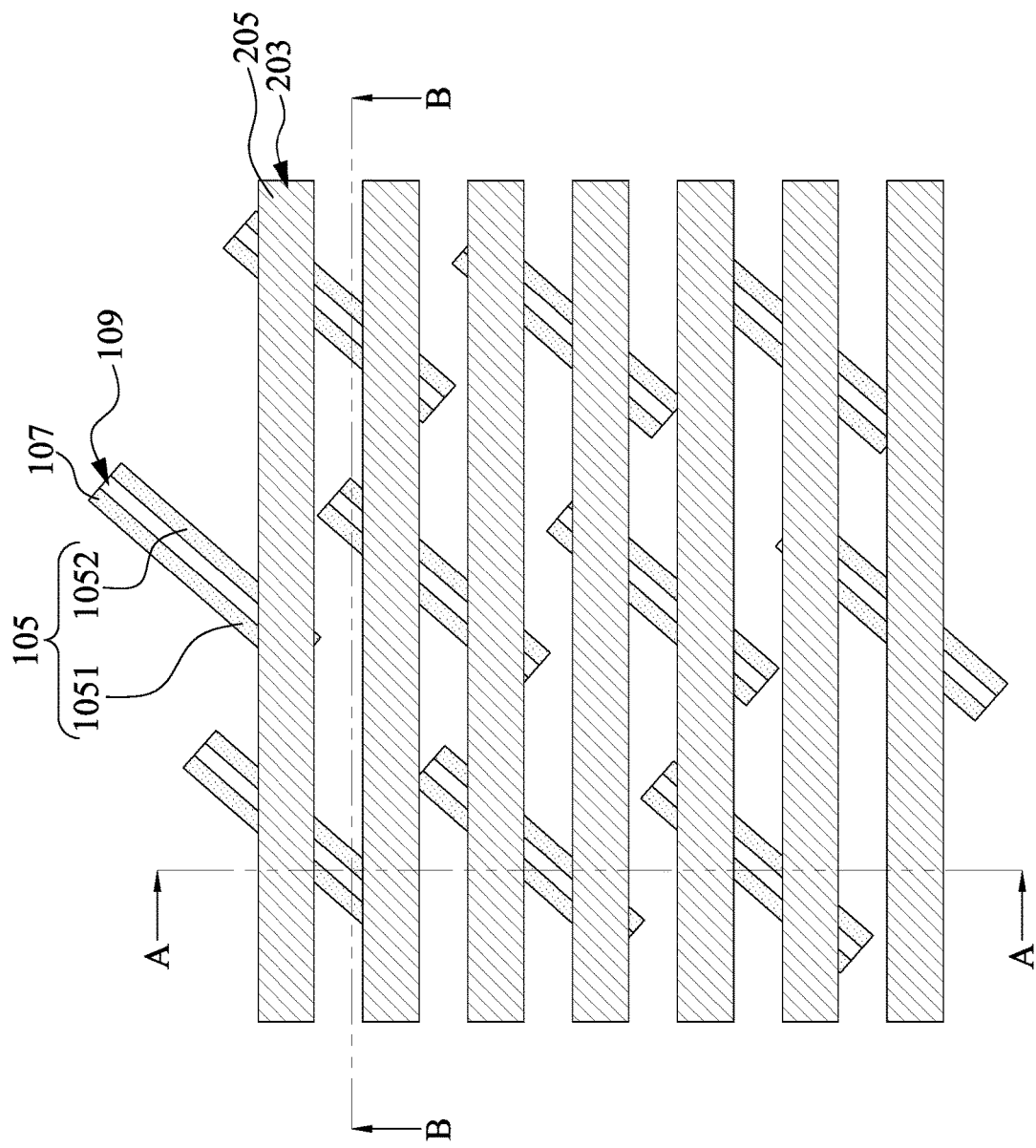
FIG. 16 illustrates one or more stages of a method of manufacturing a semiconductor device in accordance with some embodiments of the present disclosure.
Figure 17:
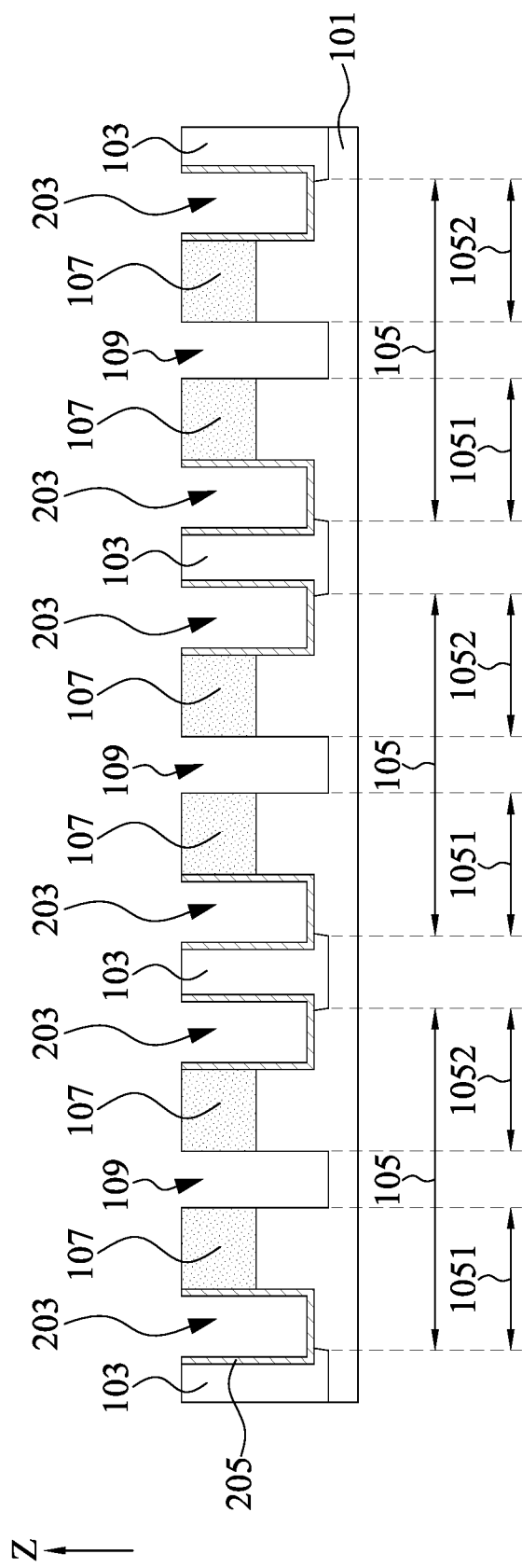
FIG. 17 illustrates one or more stages of a method of manufacturing a semiconductor device in accordance with some embodiments of the present disclosure.
Figure 18:
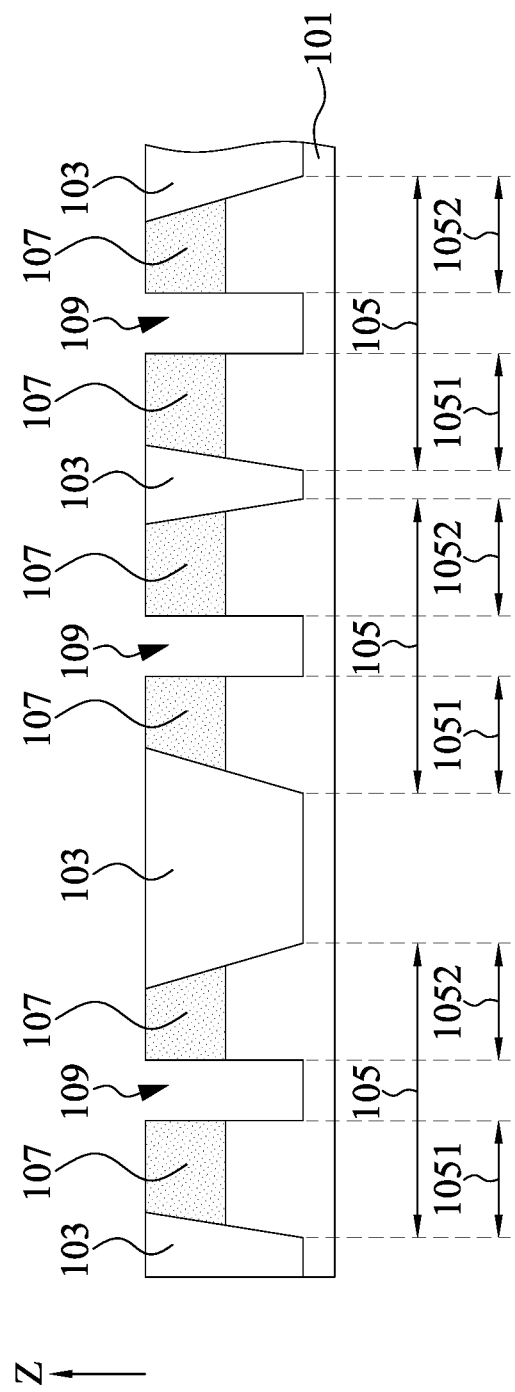
FIG. 18 illustrates one or more stages of a method of manufacturing a semiconductor device in accordance with some embodiments of the present disclosure.

FIG. 16 illustrates, in a schematic top-view diagram, part of the flow of fabricating the semiconductor device in accordance with one embodiment of the present disclosure. FIGS. 17 and 18 illustrate, in schematic cross-sectional diagrams, part of the flow of fabricating the semiconductor device in accordance with FIG. 16. For simplicity, the isolation layer 103 is not shown in FIG. 16.

As shown in FIGS. 16 to 17, a plurality of word line insulating layers 205 are correspondingly formed to conformally cover inner surfaces of the plurality of word line trenches 203. In some embodiments, the plurality of word line insulating layers 205 may be formed of, for example, silicon oxide, silicon nitride, silicon oxynitride, silicon nitride oxide, fluoride-doped silicate, or the like. Alternatively, in another embodiment, the plurality of word line insulating layers 205 may be formed of, for example, barium strontium titanate, lead zirconium titanate, titanium oxide, aluminum oxide, hafnium oxide, yttrium oxide, zirconium oxide, or the like.

Figure 19:
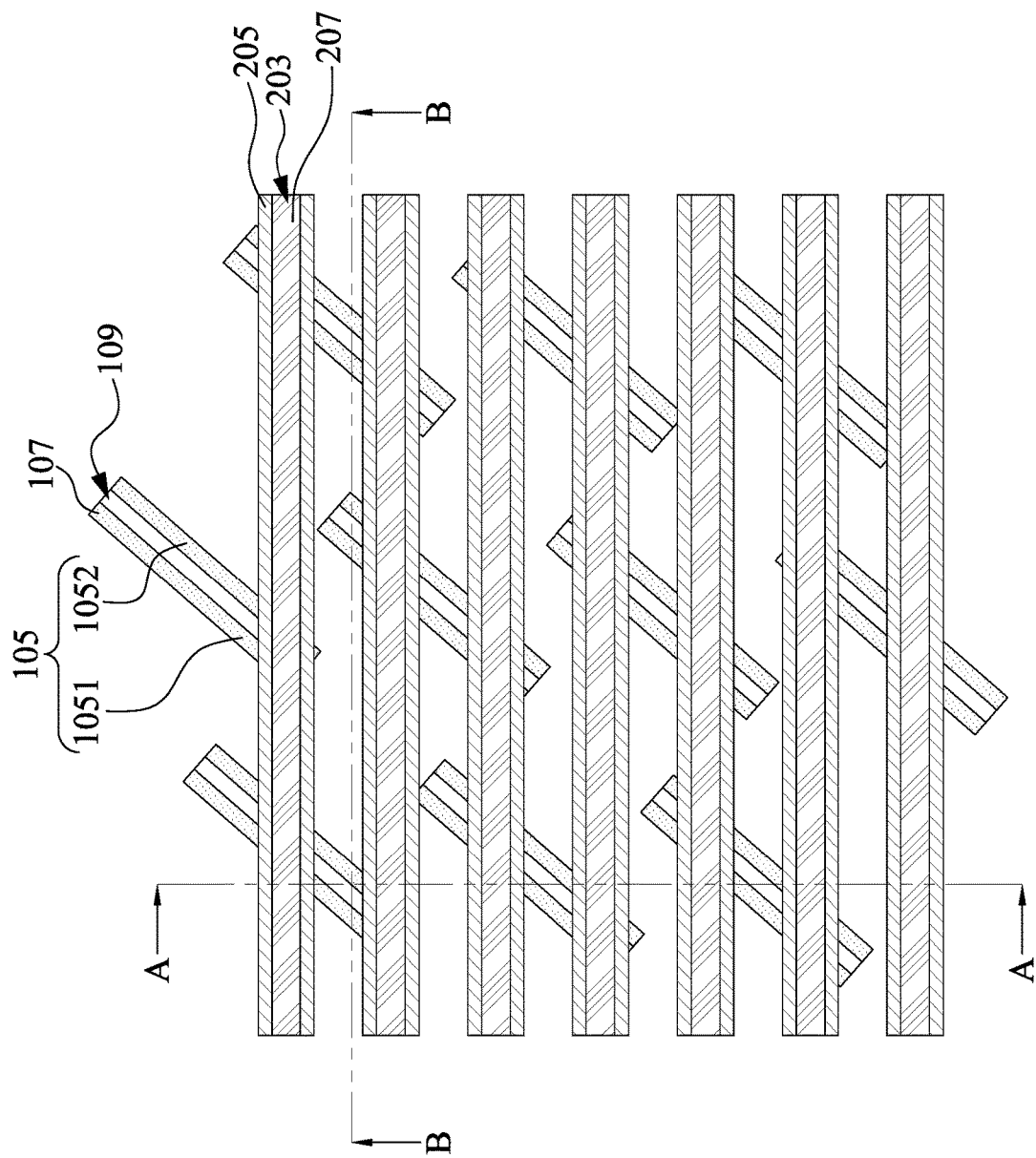
FIG. 19 illustrates one or more stages of a method of manufacturing a semiconductor device in accordance with some embodiments of the present disclosure.
Figure 20:
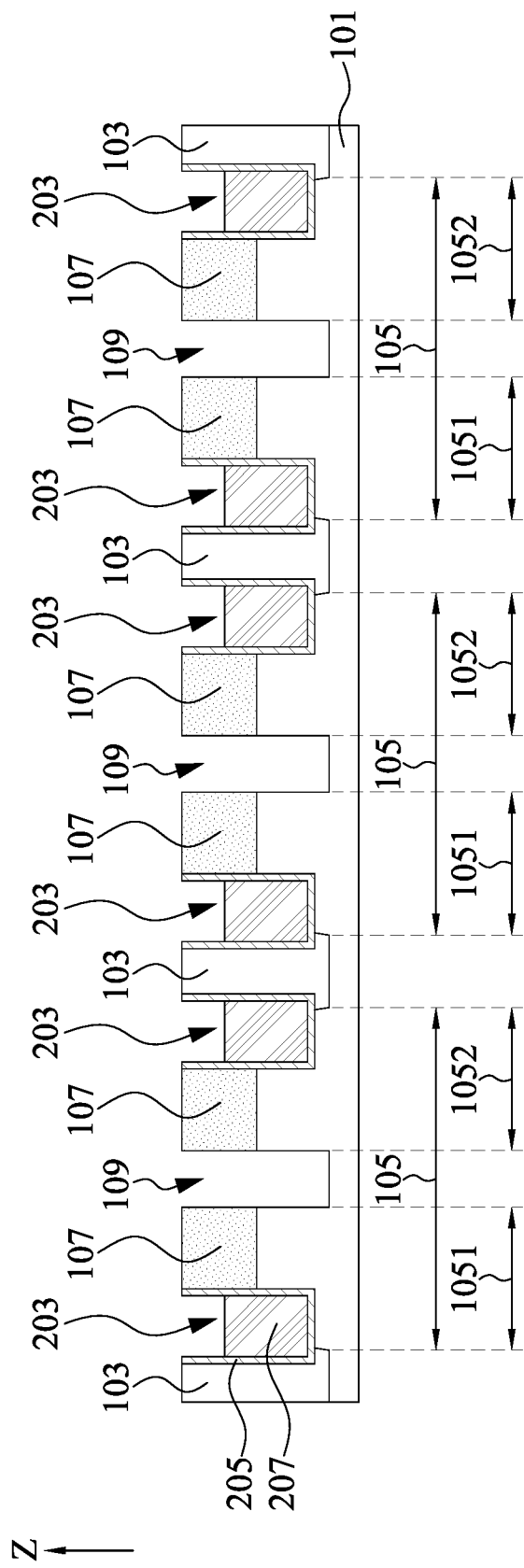
FIG. 20 illustrates one or more stages of a method of manufacturing a semiconductor device in accordance with some embodiments of the present disclosure.
Figure 21:
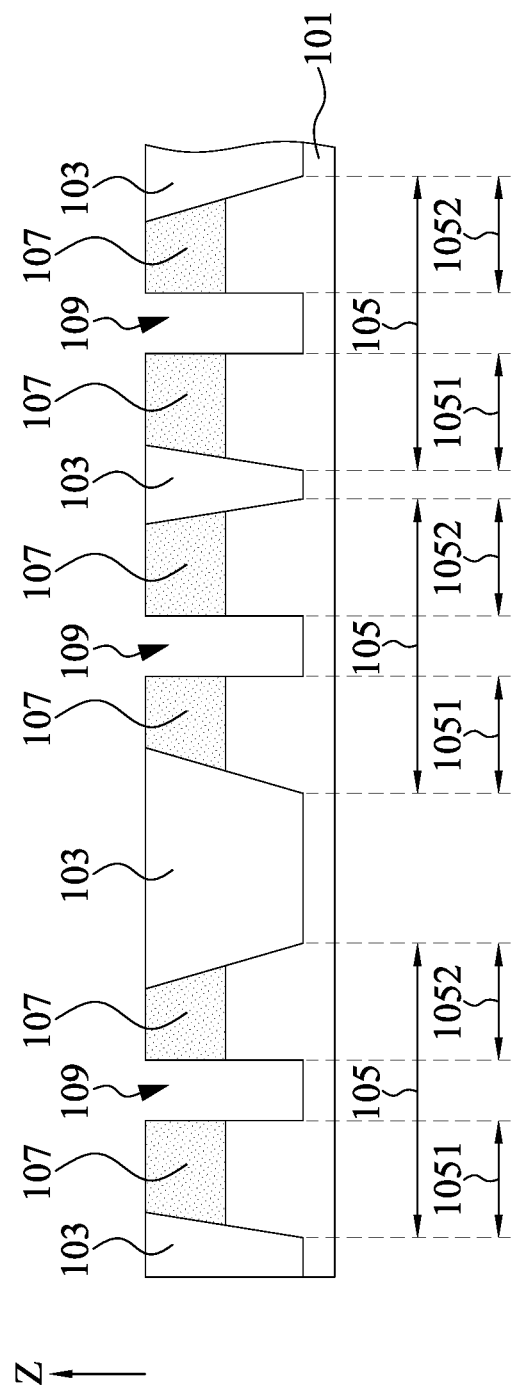
FIG. 21 illustrates one or more stages of a method of manufacturing a semiconductor device in accordance with some embodiments of the present disclosure.

FIG. 19 illustrates, in a schematic top-view diagram, part of the flow of fabricating the semiconductor device in accordance with one embodiment of the present disclosure. FIGS. 20 and 21 illustrate, in schematic cross-sectional diagrams, part of the flow of fabricating the semiconductor device in accordance with FIG. 19. For simplicity, the isolation layer 103 is not shown in FIG. 19.

As shown in FIGS. 19 to 20, a plurality of word line electrodes 207 may be correspondingly formed on the plurality of word line insulating layers 205 in the plurality of word line trenches 203. In some embodiments, a metal layer formed of a conductive material, for example, doped polysilicon, a metal, or a metal silicide, may be disposed into the plurality of word line trenches 203 by a metallization process. After the metallization process, an etch process may be performed on the metal layer to leave a lower portion of the metal layer in the plurality of word line trenches 203. The plurality of word line electrodes 207 may be correspondingly formed on the plurality of word line insulating layers 205 in the plurality of word line trenches 203. The metal may be, for example, aluminum, copper, tungsten, cobalt, or an alloy thereof. The metal silicide may be, for example, nickel silicide, platinum silicide, titanium silicide, molybdenum silicide, cobalt silicide, tantalum silicide, tungsten silicide, or the like.

Figure 22:
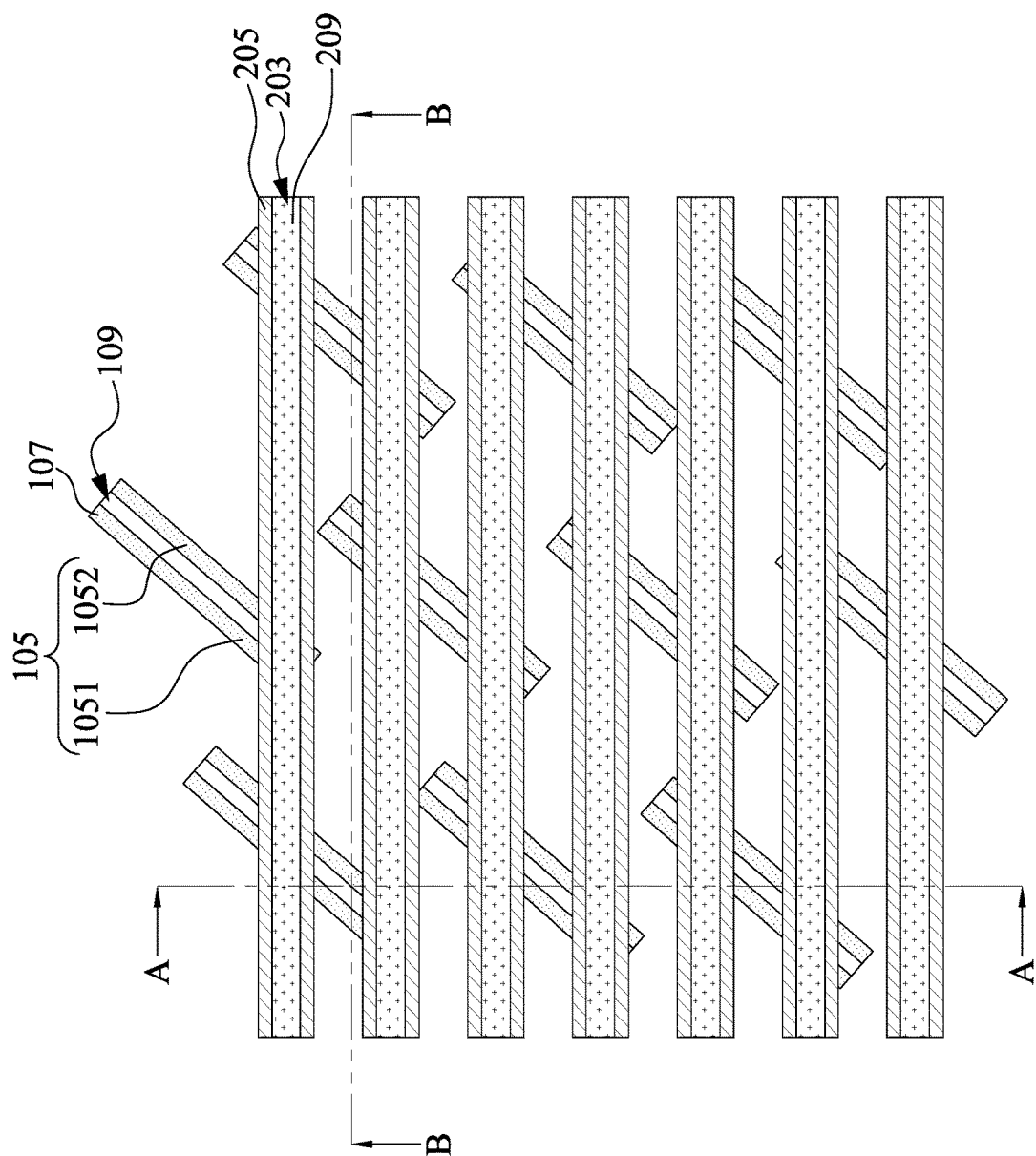
FIG. 22 illustrates one or more stages of a method of manufacturing a semiconductor device in accordance with some embodiments of the present disclosure.
Figure 23:
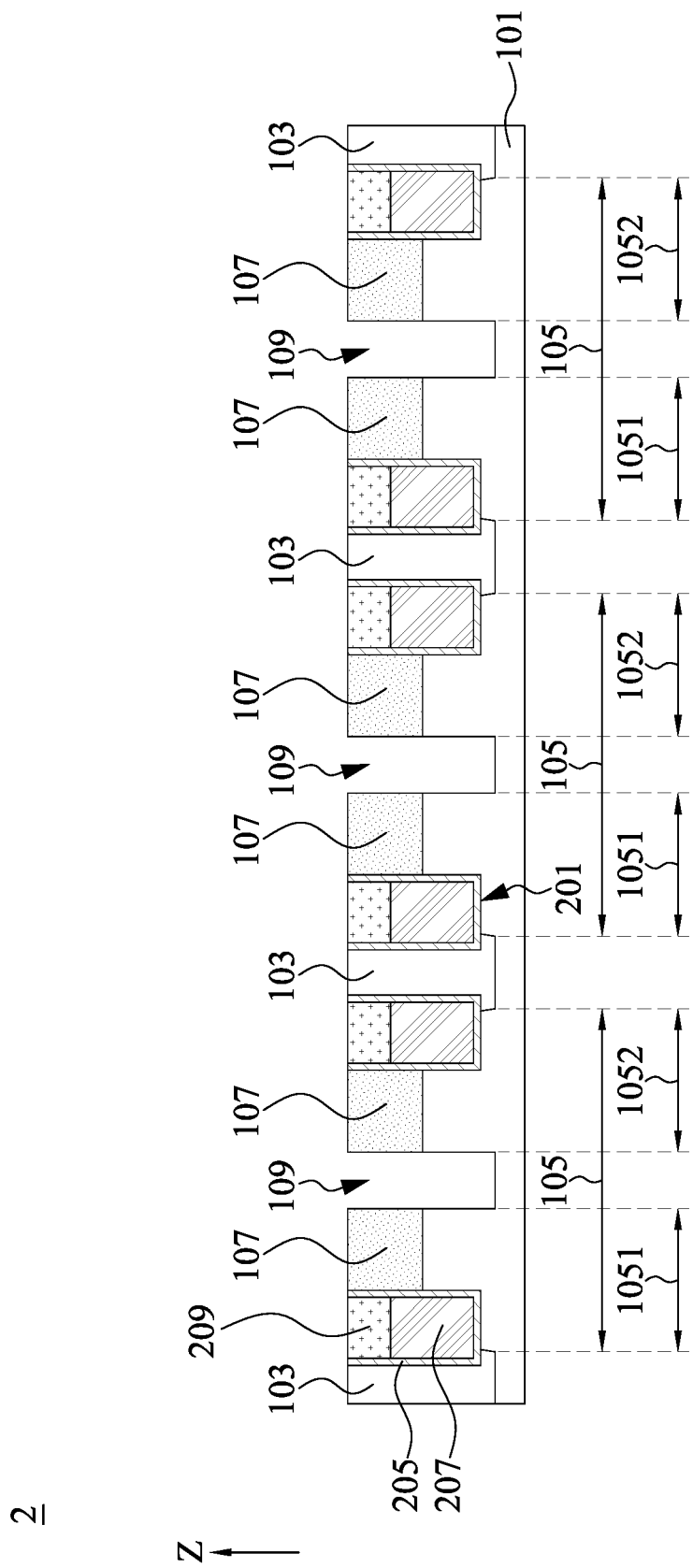
FIG. 23 illustrates one or more stages of a method of manufacturing a semiconductor device in accordance with some embodiments of the present disclosure.
Figure 24:
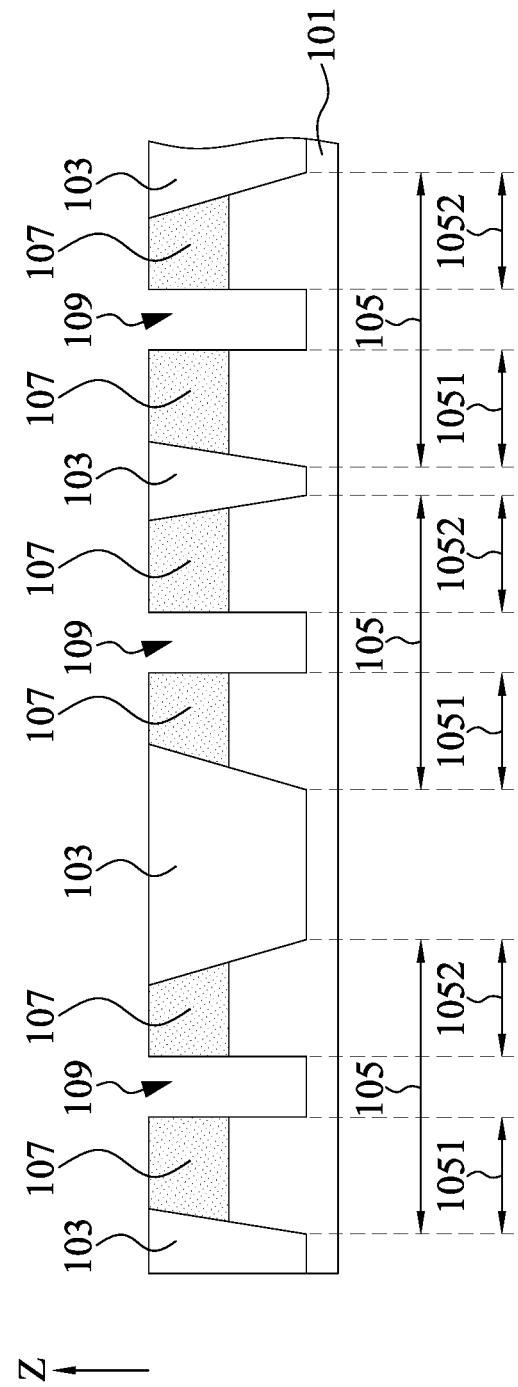
FIG. 24 illustrates one or more stages of a method of manufacturing a semiconductor device in accordance with some embodiments of the present disclosure.

FIG. 22 illustrates, in a schematic top-view diagram, part of the flow of fabricating the semiconductor device in accordance with one embodiment of the present disclosure. FIGS. 23 and 24 illustrate, in schematic cross-sectional diagrams, part of the flow of fabricating the semiconductor device in accordance with FIG. 22. For simplicity, the isolation layer 103 is not shown in FIG. 22.

As shown in FIGS. 22 to 23, a plurality of word line capping structures 209 may be correspondingly formed on the plurality of word line electrodes 207 in the plurality of word line trenches 203. The plurality of word line capping structures 209 may correspondingly fill the plurality of word line trenches 203. Top surfaces of the word line capping structures 209 may be at the same vertical level as a vertical level of a top surface of the substrate 101. The top surface of the word line capping structure 209 and a top surface of the isolation layer 103 are substantially coplanar.

Each of the plurality of word line capping structures 209 may be formed as a stacked layer or a single layer. For example, in the embodiment depicted, the plurality of word line capping structures 209 may be formed of single layers including barium strontium titanate, lead zirconium titanate, titanium oxide, aluminum oxide, hafnium oxide, yttrium oxide, zirconium oxide, or the like. Alternatively, in another embodiment, the plurality of word line capping structures 209 may be formed of stacked layers. Each stacked layer may include a bottom layer and a top layer. The bottom layers may be correspondingly disposed on the plurality of word line electrodes 207. The top layers may be disposed on the bottom layer and the top surfaces of the top layers may be at the same vertical level as that of the top surface of the substrate 101. The bottom layers may be formed of, for example, a high dielectric-constant material such as barium strontium titanate, lead zirconium titanate, titanium oxide, aluminum oxide, hafnium oxide, yttrium oxide, zirconium oxide, or the like. The top layers may be formed of, for example, a low dielectric-constant material such as silicon oxide, silicon nitride, silicon oxynitride, silicon nitride oxide, fluoride-doped silicate, or the like. The top layers formed of the low dielectric-constant material may reduce an electric field at the top surface of the substrate 101, such that leakage current may be reduced. The plurality of word line trenches 203, the plurality of word line insulating layers 205, the plurality of word line electrodes 207, and the plurality of word line capping structures 209 together form the plurality of word lines 201. The semiconductor device 2 is formed.

According to the structure, the semiconductor device 2 may have double bit capacity.

In some embodiments, according to some needs, a dielectric layer may be subsequently formed on the top surface 101-1 of the substrate 101 to cover the isolation layer 103 and the word lines 201. The dielectric layer may be a single layer or multiple layers. The dielectric layer may include silicon oxide ($SiO_2$), silicon nitride ($Si_3N_4$), silicon oxynitride ($N_2OSi_2$), silicon nitride oxide ($N_2OSi_2$), etc. Subsequently, the dielectric layer may be patterned to form an opening, and then, a bit-line structure may be formed in the opening. The bit-line structure may include a bit-line, a bit line hard mask layer and a spacer. The bit-line structure may be electrically connected to the doped region 107. The semiconductor device 2 may additionally include the dielectric layer and the bit-line structure according to some needs.

Figure 25:
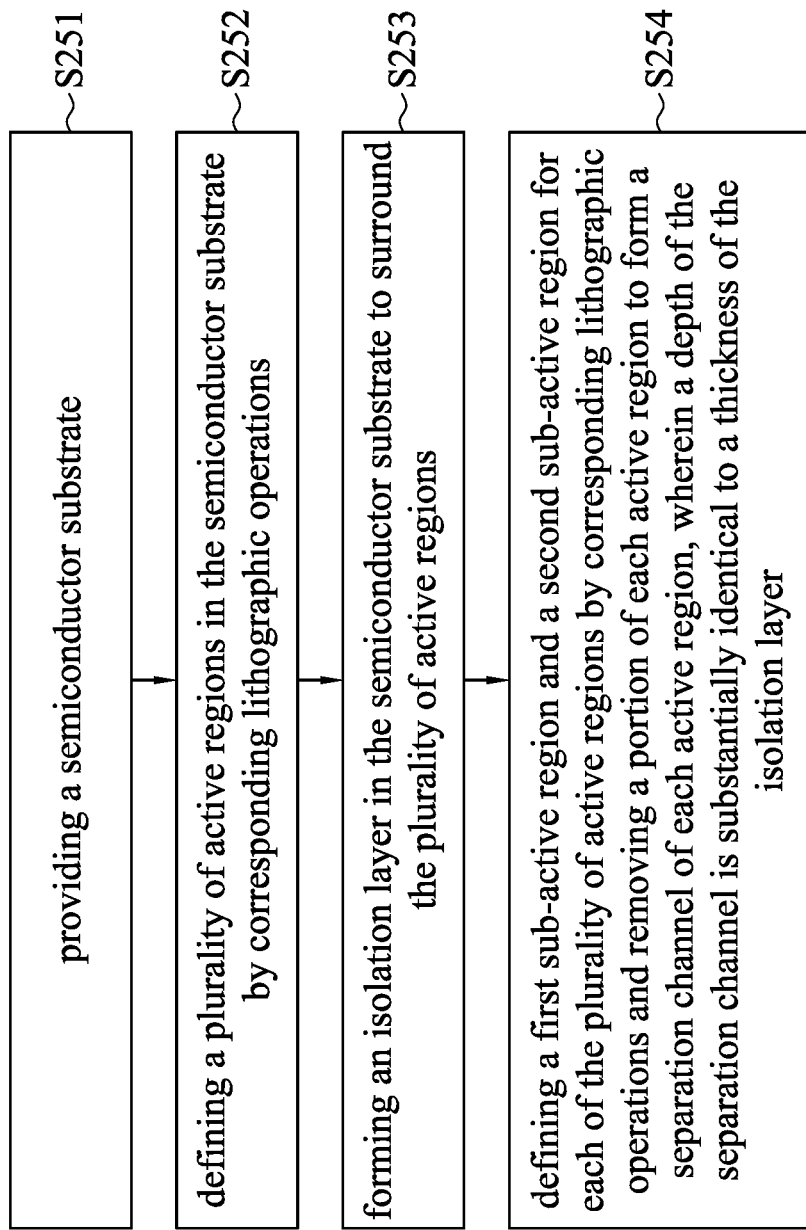
FIG. 25 illustrates a flow chart of a method of manufacturing a semiconductor device in accordance with some embodiments of the present disclosure.

FIG. 25 illustrates a flow chart of a method 250 of manufacturing a semiconductor device in accordance with some embodiments of the present disclosure.

In some embodiments, the method 250 may include a step S251 of providing a semiconductor substrate. For example, as shown in FIG. 3, the semiconductor substrate 101 includes a top surface 101-1. The following processes may be performed on the top surface 101-1 of the semiconductor substrate 101.

In some embodiments, the method 250 may include a step S252 of defining a plurality of active regions in the semiconductor substrate by corresponding lithographic operations. For example, as shown in FIGS. 4-6, the plurality of active regions 105 may be patterned by multi-layer hard masks. Shapes of the plurality of active regions 105 may correspond to shapes of the multi-layer hard masks In some embodiments, the method 250 may include a step S253 of forming an isolation layer in the semiconductor substrate to surround the plurality of active regions. For example, as shown in FIGS. 4-6, the isolation layer 103 may be formed through an STI (shallow trench isolation) process. The isolation layer 103 may have a thickness D1. The isolation layer 103 may separate the plurality of active regions 105 from one another.

In some embodiments, the method 250 may include a step S254 of defining a first sub-active region and a second sub-active region for each of the plurality of active regions by corresponding lithographic operations and removing a portion of each active region to form a separation channel of each active region, wherein a depth of the separation channel is substantially identical to a thickness of the isolation layer. For example, as shown in FIGS. 10-12, one active region 105 may be patterned by a photolithography process to define the sub-active region 1051 and the sub-active region 1052 of the active region 105. An etch process may be performed after the photolithography process to form a separation channel 109 in the active region 105. The separation channel 109 has a depth D2 which is substantially identical to the thickness D1 of the isolation layer 103.

Subsequently, the photolithography process and the etching process may be repeatedly performed to pattern another active region 105 to form the separation channel 109, the sub-active region 1051, and the sub-active region 1052 of said active region 105.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device, comprising:
a semiconductor substrate comprising:
a first active region having a first sub-active region, a second sub-active region, and a first separation channel separating the first sub-active region from the second sub-active region; and
an isolation layer adjacent to the first active region;
a trench in the semiconductor substrate intersecting the first sub-active region and the second sub-active region of the first active region;
a word line structure in the trench and adjacent to the first active region, wherein the word line structure comprises:
a word line insulating layer covering inner side surfaces of the trench;
a word line electrode on the word line insulating layer; and
a word line capping structure on the word line electrode,
wherein a depth of the first separation channel is substantially identical to a thickness of the isolation layer;
wherein a thickness of the word line structure is substantially identical to a thickness of the isolation layer.

2. The semiconductor device of claim 1, wherein the first sub-active region is defined by the first separation channel and the isolation layer.

3. The semiconductor device of claim 1, wherein the second sub-active region is defined by the first separation channel and the isolation layer.

4. The semiconductor device of claim 1, wherein the first active region has at least one angled corner.

5. The semiconductor device of claim 4, wherein the angled corner is a right angle.

6. The semiconductor device of claim 4, wherein the angled corner is an obtuse angle.

7. The semiconductor device of claim 1, wherein the first active region has a first corner and a second corner adjacent to the first corner, and the first corner and the second corner are symmetric.

8. The semiconductor device of claim 1, wherein the first active region includes a doped region.

9. The semiconductor device of claim 8, wherein the first sub-active region includes a first doped region and the second sub-active region includes a second doped region.

10. The semiconductor device of claim 1, wherein the semiconductor substrate further includes a second active region having a third sub-active region, a fourth sub-active region, and a second separation channel separating the third sub-active region from the fourth sub-active region.

11. The semiconductor device of claim 10, wherein the trench intersects the first sub-active region and the second sub-active region of the first active region and the third sub-active region and the fourth sub-active region of the second active region.

12. A method of manufacturing a semiconductor device, comprising:
providing a semiconductor substrate;
defining a plurality of active regions in the semiconductor substrate by corresponding lithographic operations;
forming an isolation layer in the semiconductor substrate to surround the plurality of active regions; and
defining a first sub-active region and a second sub-active region for each of the plurality of active regions by corresponding lithographic operations and removing a portion of each active region to form a separation channel of each active region;
wherein a depth of the separation channel is substantially identical to a thickness of the isolation layer;
wherein an ion implantation operation is performed on the plurality of active regions after forming an isolation layer.

13. The method of claim 12, wherein the removal operation includes an etching operation, and wherein a depth bias between the depths of the separation channels of the plurality of active regions is between 0 to 25%.

14. The method of claim 13, wherein the depth bias between the depths of the separation channels of the plurality of active regions is between 0 to 15%.

15. The method of claim 13, wherein the depth bias between the depths of the separation channels of the plurality of active regions is between 0 to 5%.

16. The method of claim 13, wherein the depth bias between the depths of the separation channels of the plurality of active regions is substantially 0.

17. The method of claim 12, wherein each active region is formed to have at least one angled corner.

18. The method of claim 17, wherein the angled corner is a right angle.

19. The method of claim 17, wherein the angled corner is an obtuse angle.

* * * * *